US012811092B2

(12) United States Patent
Kieft et al.

(10) Patent No.: US 12,811,092 B2
(45) Date of Patent: Nov. 24, 2026

(54) ADAPTIVE DWELL TIME MICROSCOPY

(71) Applicant: FEI COMPANY, Hillsboro, OR (US)

(72) Inventors: Erik Kieft, Eindhoven (NL); Ruud Krijnen, Eindhoven (NL); Lambertus de Vries, Harlingen (NL); Bert Freitag, Brueggen (DE); Maarten Bischoff, Uden (NL); Pybe Faber, Eindhoven (NL); Christiaan Kok, Eindhoven (NL); Mark van der Zande, Eindhoven (NL); Jeroen Horikx, Eindhoven (NL)

(73) Assignee: FEI Company, Hillsboro, OR (US)

( * ) Notice: Subject to any disclaimer, the term of this patent is extended or adjusted under 35 U.S.C. 154(b) by 306 days.

(21) Appl. No.: 18/769,746

(22) Filed: Jul. 11, 2024

(65) Prior Publication Data

US 2026/0018375 A1 Jan. 15, 2026

(51) Int. Cl.

*H01J 37/28* (2006.01)
*H01J 37/244* (2006.01)
*H01J 37/26* (2006.01)

(52) U.S. Cl.

CPC .......... *H01J 37/263* (2013.01); *H01J 37/244* (2013.01); *H01J 37/265* (2013.01); *H01J 37/28* (2013.01)

(58) Field of Classification Search

CPC ........ H01J 37/28; H01J 37/244; H01J 37/263; H01J 37/265

See application file for complete search history.

(56) References Cited

U.S. PATENT DOCUMENTS 11,848,173 B1 12/2023 Reed et al.
2010/0282964 A1* 11/2010 Bunton ................ H01J 37/285 250/282
2022/0205936 A1 6/2022 Kocar

FOREIGN PATENT DOCUMENTS

EP 2707893 B1 1/2019

OTHER PUBLICATIONS

EP25186726.3, "Extended European Search Report", Dec. 15, 2025, 10 pages.

* cited by examiner

*Primary Examiner* — Sean Luck

(74) *Attorney, Agent, or Firm* — Kilpatrick Townsend & Stockton LLP

(57) ABSTRACT

A method for adaptive pixel dwell time usage in a microscope that includes scanning a beam emitted by a beam source over a sample in a scan pattern such that the beam interacts with the sample at a first scanning location according to the scan pattern. In some examples, the method includes monitoring, by at least using a detector of the microscope, a first cumulative number of particles associated with the first scanning location of the sample such that the first cumulative number of particles correspond to an interaction of the beam with the sample at the first scanning location. In some examples, the method includes moving, after a first dwell time and before a first dwell period elapses, the beam to a second scanning location of the sample according to the scan pattern if a signal criterion is met such that the signal criterion is based on the first cumulative number of particles.

20 Claims, 15 Drawing Sheets

ADAPTIVE DWELL TIME MICROSCOPY

The present disclosure is directed to charged particle microscope system components, systems, and methods. More particularly, the present disclosure describes adaptive dwell times in charged particle microscope systems.

BACKGROUND

Material studies that involve characterizing the properties (e.g., structure, topography and chemical composition) of probes in the micro- and nanoscopic regime, can be performed through the implementation of scanning microscope systems, such as scanning electron microscopes (SEMs). A SEM is configured to scan the surface of the sample with a primary beam (e.g., an electron beam) and acquire an image of the sample based on various types of emissions e.g., emissions of backscattered, transmitted or secondary electrons. These emissions result from the interaction of the electron beam with the particles of the sample (such as atoms). Backscattered electrons (BSE) originate from the primary electron beam, which, as the name suggests, are reflected back (e.g., out of the sample) via elastic scattering on the sample atoms. The number of backscattered electrons at each scanning location on the sample depends on the atomic number of the chemical elements (e.g. mineral elements) located at corresponding scanning locations. Thus, the brightness variations (e.g., gray-level variations) within a BSE image are indicative of the composition variations within the sample.

Along with the emissions of backscattered electrons, emissions of X-rays can also emerge from the interaction of the primary beam with the sample. In particular, characteristic X-rays are emitted when primary electrons cause the ejection of an electron in an inner shell of a sample atom, creating an electron hole. This electron hole is then filled by another electron from an outer atomic shell through the emission of an X-ray photon. The energy of that X-ray photon corresponds to the energy difference between the outer and inner shell. Thus, the emitted X-rays have energies that are unique for the corresponding chemical elements and their detection can therefore reveal the chemical composition of the sample. For the detection of X-ray emissions, SEMs may be equipped with X-ray spectrometers that are configured to measure the number of detected X-rays with respect to their energies (energy-dispersive spectrometers, EDS) or their wavelengths (wavelength-dispersive spectrometers, WDS). Material analysis (e.g., mineralogy classification) commonly involves coupling the backscattered electron imaging process with the application of X-ray spectroscopy. However, the X-ray acquisition takes a few milliseconds per scanning location. Thus, obtaining the compositional information of the entire sample based on the X-ray detection from tens or hundreds of thousands of scanning locations can be highly time-consuming, lasting from several minutes to a few hours.

BRIEF SUMMARY

In some embodiments, a method for adaptive pixel dwell period usage in a microscope includes scanning a beam emitted by a beam source over a sample in a scan pattern such that the beam may interact with the sample at a first scanning location according to the scan pattern. In addition, the method may include monitoring, by at least using a detector of the microscope, a first cumulative number of particles associated with the first scanning location of the sample and detected at the first scanning location of the scan pattern such that the first cumulative number of particles may correspond to an interaction of the beam with the first scanning location of the sample. In some embodiments, the method may include moving, after a first dwell time and before a first dwell period elapses, the beam to a second scanning location of the scan pattern if a signal criterion is met such that the signal criterion may be based on the first cumulative number of particles.

In some embodiments, the signal criterion may include a first threshold number such that the signal criterion being met includes the first cumulative number reaching or exceeding the first threshold number.

In some embodiments, the signal criterion may include a first threshold number. In addition, the method may include determining if a second cumulative number of particles reaches or exceeds the first threshold number during a second dwell period such that the second dwell period may be shorter than the first dwell time.

In some embodiments, the method may include detecting X-ray photons, ultraviolet photons, visible photons, infrared photons, charged particles, or combinations thereof.

In some embodiments, the method may include determining if a subset of particles of the first cumulative number of particles detected meets a second signal criterion during the first dwell time and controlling, based on the subset of particles meeting the second signal criterion during the first dwell time, the beam according to the scan pattern to continue to scan the first scanning location of the sample for either: i) a second dwell period and/or ii) until the signal criterion is met. In addition, the method includes moving, based on at least one of: the second dwell period elapsing or the signal criterion being met given a total number of particles being detected, the beam according to the scan pattern to the second scanning location.

In some embodiments, the method may include determining that a second cumulative number of particles detected at the second scanning location is less than a third threshold number within a third dwell period and moving, based on the third dwell period elapsing, the beam to a third scanning location of the scan pattern.

In some embodiments, the detector may include a first detector and a second detector. In addition, the method may further include monitoring, by at least using the first detector, a second cumulative number of particles detected at the second scanning location and determining that the second cumulative number does not meet the signal criterion. In addition, the method may include determining that a third cumulative number of particles detected at the second scanning location by the second detector meets the signal criterion based on the second cumulative number of particles not meeting the signal criterion. In some embodiments, the method may include moving, based on the third cumulative number of particles meeting the signal criterion, the beam to a third scanning location of the scan pattern.

In some embodiments, the method may include determining an image pixel intensity value based on the first dwell time.

In some embodiments, the scan pattern may include a variable staircase pattern. In addition, a scan controller may have a bandwidth to facilitate moving the beam according to the variable staircase pattern.

In some embodiments, a non-transitory computer readable medium having stored thereon computer-readable instructions that, when executed by a processor, cause the processor to perform operations that may include controlling a beam source of a microscope to emit a beam towards a sample according to a scan pattern such that the beam interacts with a first scanning location of the sample. The operations may further include monitoring, by at least using a detector of the microscope, a first cumulative number of particles associated with the first scanning location of the sample and detected at the first scanning location of the scan pattern such that the first cumulative number of particles correspond to an interaction with the first scanning location of the sample. In some embodiments, the operations may further include moving, after a first dwell time, the beam to a second scanning location of the scan pattern before a first dwell period elapses if a signal criterion is met such that the signal criterion may be based on the first cumulative number of particles.

In some embodiments, the operations may include determining the first cumulative number of particles meets the signal criterion by a first time and storing an image pixel intensity value as a function of the first dwell time.

In some embodiments, the operations may include monitoring, by at least using the detector, a second cumulative number of particles detected at the second scanning location and determining that the second cumulative number does not meet a second signal criterion after a second dwell period has elapsed such that the second dwell period may include a total time to scan a second scanning location of the sample. In some embodiments, the operations may include storing an image pixel intensity value as a function of the second cumulative number.

In some embodiments, the operations may include monitoring, by at least using the detector, a second cumulative number of particles detected at the second scanning location and determining that the second cumulative number of particles detected at a second detector meets a second signal criterion. In some embodiments, the operations may include storing, based on the second cumulative number of particles meeting the second signal criterion, an image pixel intensity value as a function of second cumulative number of particles, a maximum intensity, and/or a minimum intensity.

In some embodiments, the detector may be one of a bright field detector or a dark field detector and the second detector may be a remaining one of the bright field detector or the dark field detector.

In some embodiments, a method for adaptive scanning in a microscope may include scanning a sample by at least using a beam source of the microscope to emit a beam towards the sample according to a first scanning pass and determining, by at least using a detector of the microscope, a first number of particles associated with a first scanning location of the sample and corresponding to a first pixel that corresponds to a first scanning location. In some embodiments, the method may include determining, based on a first comparison of the first number of particles and a signal criterion, whether the first scanning location is to be excluded from or included in a second scanning pass. In some embodiments, the method may include scanning the sample by at least directing the beam onto the sample according to the second scanning pass and generating sample acquisition data based on a total number of scanning passes.

In some embodiments, the method may include determining a total number of particles detected at the first scanning location for a number of scanning passes already completed and determining a difference between the total number of particles and the signal criterion. The method may include determining, based on the difference, whether the first scanning location is to be excluded from or included in one or more additional scanning passes such that wherein the one or more additional scanning passes may continue until the difference is equal to or smaller than zero.

In some embodiments, each scanning pass of scanning the sample may include exposing each scanning location determined to be included in the scanning pass to the beam for a fixed dwell period and excluding each scanning location determined to be excluded from the scanning pass from exposure to the beam.

In some embodiments, the method may include adjusting a dwell period for each scanning location determined to be included in a subsequent scanning pass based on the first number of particles detected at the scanning location during the first scanning pass.

In some embodiments, the method may include determining a presence of a change to the sample by identifying at least one of: i) expansion, ii) compression, iii) movement, or iv) shearing within an image of the sample generated between the first scanning pass and the second scanning pass and reducing a sample drift for a second image produced after the second scanning pass.

In some embodiments, the signal criterion is in a range of 1 to 20 charged particles.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

Figure 1:
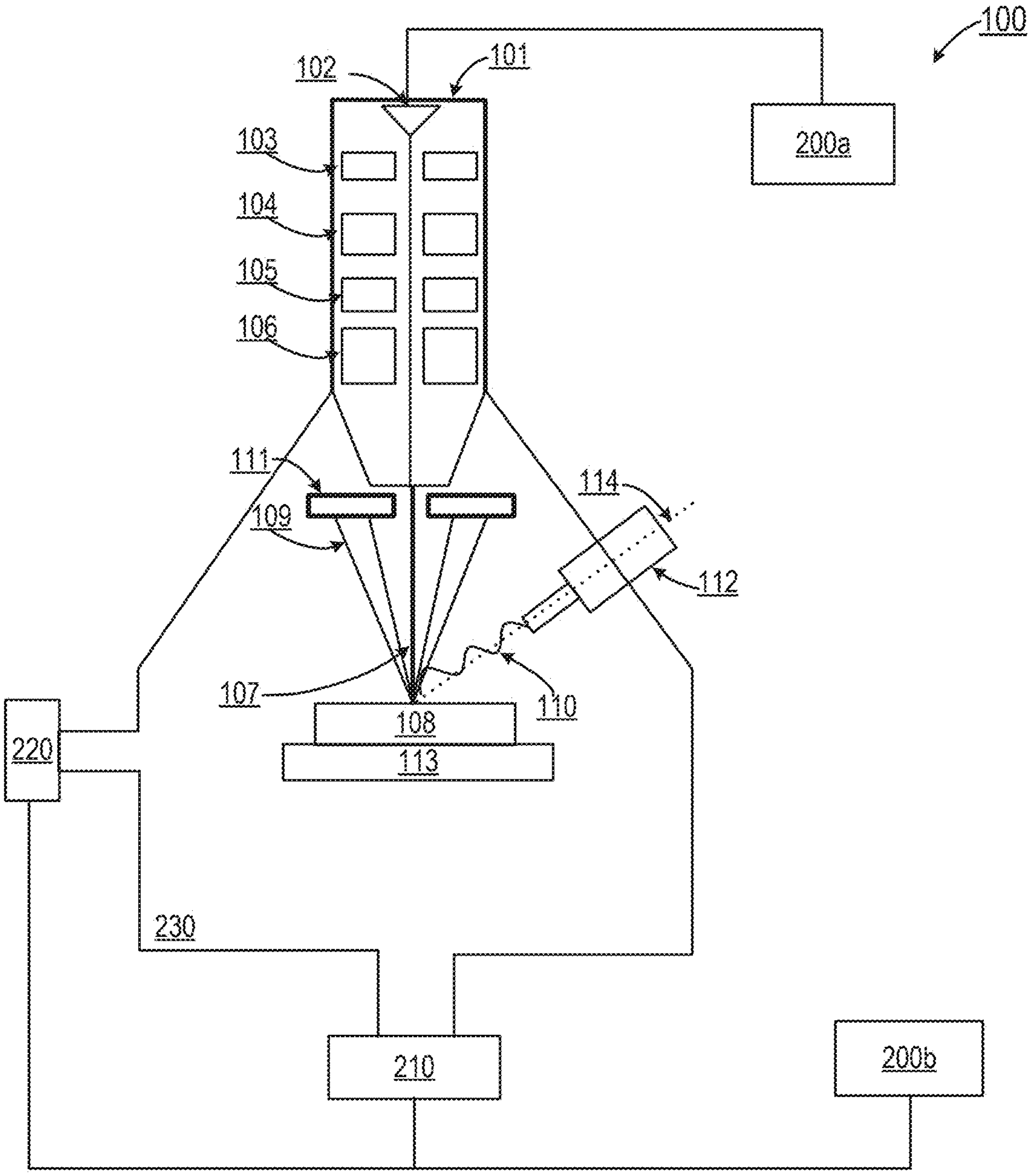
(Prior Art) FIG. 1
FIG. 1 is an example illustration of a portion of a microscope system as currently known in the art.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

Embodiments of the present invention are described below in the context of a microscope system. In an example, the microscope system is configured for acquiring an image of a sample using scan patterns (e.g., saw-tooth staircase pattern). The scanning may result in the image being generated. The scanning may be adaptive in time such that the dwell time per image pixel may vary. In some instances, multiple detectors may be used to detect different modalities such as bright field and/or dark field electrons. These and other features of the present disclosure are further described herein below. It should be understood that the methods described herein are generally applicable to a wide range of different methods and apparatus, including electron energy loss spectroscopy (EELS), energy filtered transmission electron microscopy (EFTEM), transmission electron microscopy (TEM), scanning electron microscopy (SEM), energy-dispersive X-ray (EDX) spectroscopy, scanning transmission electron microscopy, both scanning-probe systems and parallel illumination systems, and are not limited to any particular apparatus type, beam type, object type, length scale, or scanning trajectory.

In some embodiments, where the term “dwell time” or similar is used, it should be readily understood as an actual time spent dwelling at a location on a sample. Terms such as “first dwell time”, “second dwell time”, etc. similarly should not be considered limiting, and will be readily understood to represent specific exposure times to one or more locations on the sample. Similarly, where the term “dwell period” or similar is used, it should be readily understood to represent a bracketed time period, inclusive of two temporal end points. Terms such as “first dwell period”, “second dwell period”, etc. similarly should not be considered limiting, and will be readily understood to represent specific times ranges for respective dwell times. In a non-limiting example, a dwell period of one microsecond to two microseconds would readily be understood to include all times between, and inclusive of, one microsecond and two microseconds. A dwell time may represent one or more times smaller than, equal to, or greater than a dwell period. For example, for a dwell period between one microsecond and two microseconds may include a dwell time of one and a half microseconds, two microseconds, three microseconds, or any measured time between or outside of the bracketed time period. In addition, or alternatively, a dwell time may be greater than, equal to, or less than a dwell period depending on a location of the sample, number of particles detected, desired intensity, or combinations thereof.

Some techniques for image acquisition of samples (e.g., proteins, viruses, circuits, transistors, etc.) in SEM may need the sample to be exposed to electron beams for periods of time which may damage the samples. Certain types of samples (e.g., biological samples) are particularly sensitive to beam damage from electron beams as the electrons can cause thermal expansions, structural damage, or similar. Conventional SEMs (as well as other modalities such as conventional TEMs) may use fixed dwell times per location on a sample. For example, during a scan of a sample such as a carbon nanostructure, the electron beam may be scanned across a set number of locations on the sample. Each of the locations may be dwelled on for a fixed time regardless if the detector has detected enough particles to form a reliable image. In at least some circumstances, the dwell time may be fixed prior to imaging by a user in such conventional microscopes. In addition, some solutions may rely on the use of expensive blankers to blank the beam when a certain amount of particles have reached the detector. These solutions may use a time that the beam was unblanked to determine an image pixel intensity value. For example, if a sample location that corresponds to an image pixel is exposed for one millisecond and collects five electrons in half a millisecond, defined as an unblanked time $t_{unblank}$, then a blanked time period is the remainder of half a millisecond. The image pixel intensity value may be assigned for that location as $1/t_{unblank}$. This may result in extended scan periods where the period of time between reaching the desired number of particles and the end of the fixed dwell period is unused and the sample is unnecessarily overexposed. In addition, an electronic gain and offset (e.g., pixel contrast and pixel brightness) may need to be fixed prior the performing scanning of the sample. This may lead to certain locations of the sample being overexposed (e.g., appearing white in the image) and certain parts of the sample being underexposed (e.g., appearing black in the image). In addition to the limitations imposed by pre-fixing electronic gain and offset, electronic signal amplifiers may clip during imaging which leads to decreased image quality.

The present inventors have recognized that one novel solution to the aforementioned limitations includes making a dwell time adaptive per image pixel which corresponds to a location of the sample undergoing analysis. By presetting a desired signal-to-noise ratio, a control system may decide when enough particles (e.g., electrons) have been collected and instruct the scanning components to advance to the next location of the sample before reaching a pre-set maximum dwell period without needing an expensive beam blanker. In this configuration, the dwell time (e.g., the actual time until advancing to a next location to scan) itself may be used as an imaging quantity which may have a high dynamic range. For example, locations of the sample which generate a high signal (e.g., a large number of particles detected) will only be illuminated for a short time period. This may significantly reduce beam damage to the sample and reduce image acquisition time. In addition, for applications in bright field scanning transmission electron microscopy (BF STEM) of biological tissue, the locations of the sample which generate low signals (e.g., a few to no particles detected) may need to be illuminated (e.g., receive the beam) longer, but for BF STEM the darker locations of the sample may be typically stained which may contain heavy metal staining and are therefore more robust to beam damage.

In addition, this novel solution as recognized by the inventors, may use a scan generator with components fast enough and having sufficient bandwidth to accommodate using adaptive dwell times. For example, a saw-tooth staircase pattern is particularly useful in SEM and TEM applications, among others. By varying the length of each “stair” in an x-direction (e.g., fast scan direction) the dwell time per pixel may be adjusted in real time. Using this pattern may enable imaging pixels to be acquired quickly while also reducing a total acquisition time for the sample since the previously mentioned “blank” period of time is not needed. In addition, for locations of the sample that do not receive a certain threshold number of particles within a maximum dwell period (e.g., the longest possible dwell period), the locations of the sample may be abandoned in favor of assigning the associated image pixel a maximum value (e.g., using dwell period itself as an image pixel intensity value) thus reducing the acquisition time further. That is, dwell times for pixels which reach the threshold number of particles within the maximum dwell periods plus the maximum dwell periods for pixels which did not reach the threshold number of particles will lead to shorter acquisition times compared to methods which use maximum dwell periods for all pixels. In addition, or alternatively, a pixel value may be assigned as being proportional to the number of particles detected. In addition, or alternatively, methods which detect a certain number of particles within a short time frame may extend the time spent dwelling on a section of the pixel for quickly identifying dark and/or uninteresting parts (e.g., non-important structures and/or holes) to avoid spending unnecessary time dwelling on the dark and/or uninteresting parts of the sample.

In yet another novel solution, the inventors have recognized that adding a sub-dwell period within the dwell period may aid in limiting acquisition times. For example, if a set number of particles are not detected within the sub-dwell period for the location of a sample, one or more image pixels may be aborted immediately and the corresponding one or more image pixels assigned an image pixel intensity value (e.g., minimum intensity or similar). It should be noted that the term "location" may be referred to as a "scanned location of the sample", "scanned sample location", "scanned location", "location", or similar. In addition to reducing the time to get a result on the sample, this solution may improve a dose efficiency by extending dwell periods only on sample scanning locations from which particles are detected quickly while aborting data acquisition from sample scanning locations which may require longer dwell periods to detect enough particles. This procedure may help prevent damage to the sample as well as reduce overall operating times. In some examples, another solution that is anticipated by the inventors may involve monitoring more than one detector in addition to the previously discussed adaptive dwell time solutions. For example, a bright field detector and dark field detector may be monitored in real-time such that if a first one of the detectors fails to receive an above-threshold number of particles from a location of a sample within the dwell period (or sub-dwell period), then the beam may be controlled to skip the location, thus reducing the dwell time at that location. This procedure may be significant in reducing scan times for samples that have varying structures or properties where scattered/unscattered electrons are of importance.

In yet another solution, multi-pass scanning may be incorporated with dwell periods to scan all positions of a sample. That is, for locations for which were skipped (as discussed above), the solution may involve returning to just those specific locations for rescans. This procedure has the benefit of reducing sample drifts such as expansion, compression, movement, and shearing due to the reduced scan time of the sample as well as limiting overexposure.

FIG. 1 shows components of a scanning microscope system 100 as is currently known in the art. The scanning microscope system 100 may be configured for generating a primary beam of charged particles (e.g., electrons or ions). The scanning microscope system may further comprise a scanning electron microscope 101. In this example, the primary beam comprises an electron beam 107. An electron source 102 may be configured for emitting the electron beam, wherein a voltage is applied between the electron source 102 and an anode 103. The applied voltage may preferably range from at least 2 kV to at most 30 kV in SEM applications and the applied voltage may preferably range from at least 20 kV and 300 kV in S-TEM applications. The scanning microscope system may also comprise electromagnetic lenses. The electromagnetic lenses may be configured for controlling the path of the electron beam. At least one condensing lens 104 may be comprised by the electromagnetic lenses. The condensing lens 104 may be configured for determining the size of the electron beam. Moreover, at least one objective lens 106 may be comprised by the electromagnetic lenses. The objective lens 106 may be configured for focusing the electron beam to a scanning location on the sample. The scanning location may correspond to an electron-beam spot on a sample 108. Further, the dimensions and the shape of the scanning location may depend on the focusing properties of the electromagnetic lenses (e.g. applied current) and the working distance between the scanning electron microscope 101 and the sample 108. A scanning coil 105 may be configured for deflecting the electron beam 107 over a plurality of scanning locations in one or two dimensions. Thus, advantageously, this may enable a two-dimensional scanning of the sample. The scanning coil 105 may be magnetic or electrostatic.

The scanning microscope system can be configured for generating and detecting first and second emissions 109, 110 from the sample. The electron beam 107 may interact with particles (such as atoms) of the sample 108. The interaction may result in the stimulation of the first and the second emissions 109, 110. The first emissions 109 may comprise emissions of charged particles, such as backscattered electrons. However, the first emissions may also comprise emissions of secondary, transmitted and/or Auger electrons. Further, the second emissions 110 may comprise emissions of photons, such as X-rays and/or light (e.g., visible light).

The scanning microscope system 100 may also comprise a first detector 111, wherein the first detector 111 may be configured for detecting the first emissions 109 from the first scanning locations in a sequential manner. In particular, the first detector 111 may be configured for detecting the first emissions over a first dwell time at each first scanning location. In some examples, the first detector 111 may comprise a backscattered electron detector, such as a segmented silicon drift detector. However, the backscattered electron detector may also correspond to other types of solid-state detectors. Moreover, the first detector 111 may also comprise a secondary electron detector, such as an Everhart-Thornley detector, or a transmitted electron detector (e.g. CMOS detector). The transmitted electron detector may be placed below the sample 108 in order to detect transmitted electrons.

Further, the electron microscope system may comprise a second detector 112, wherein the second detector 112 may be configured for detecting the second emissions 110 from the second scanning locations in a sequential manner. In particular, the second detector 112, may be configured for detecting the second emissions. The second detector 112 may comprise an X-ray detector, wherein the X-ray detector may comprise a silicon drift detector. However, the X-ray detector may also comprise other types of detectors (e.g., scintillation detectors). The second detector 112 may be tilted with respect to the surface of the sample 108. The angle between a center line 114 of the second detector and the sample surface may be adjustable and may range from 0° to at most 90°.

The X-ray detector may be comprised by an energy-dispersive spectrometer (EDS). The energy bandwidth of the EDS may range from zero to at most seventeen keV. In another modality, the X-ray detector may comprise a wavelength-dispersive spectrometer (WDS). Further, the second detector 112 may also comprise an electron energy loss spectrometer or a cathodoluminescence spectrometer.

The sample 108 may be positioned on top of a movable stage 113. The movable stage 113 may be configured for performing two horizontal movements, a vertical movement, a tilting movement, and/or a rotational movement, either within or with respect to the plane of the sample. The two horizontal movements may comprise selecting a field of view. The vertical movement may change a height of the sample and thus the depth of focus and/or the image resolution.

Figure 2:
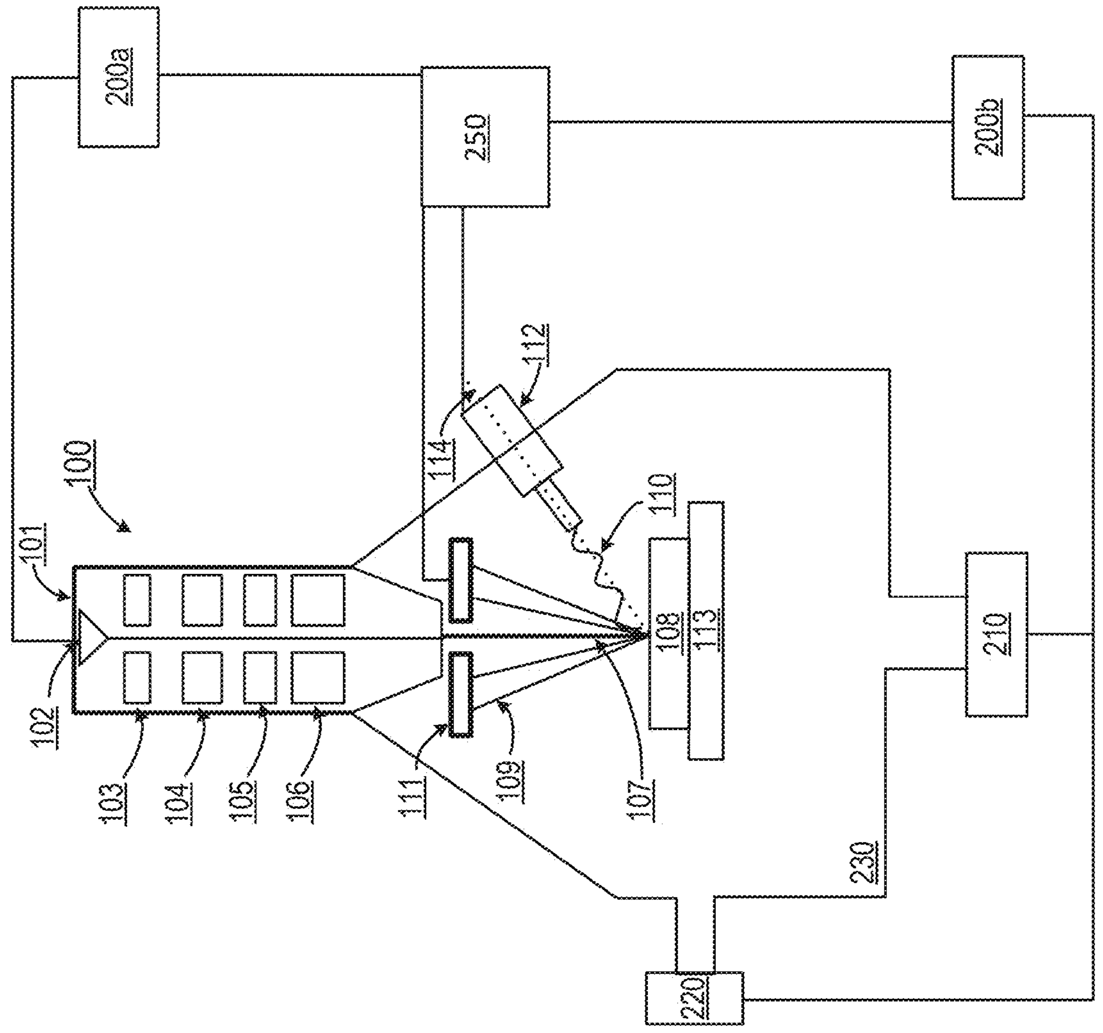
FIG. 2 is a schematic diagram of a charged particle microscope system, according to some embodiments.

FIG. 2 is a schematic diagram of a charged particle microscope system, according to some embodiments. The scanning microscope system 100 may further comprise a control unit 200*a*. The control unit 200*a* may be configured for controlling the power supply and operation of the condensing lens 104, the objective lens 106, the scanning coil 105 and the movable stage 113. Further, the scanning microscope system may comprise a vacuum system. The vacuum system may comprise a vacuum controller 200*b*, a mechanical pumping system 210, an ultra-high vacuum pump 220 (such as an ion pump) and a vacuum chamber 230. The vacuum controller 200*b* may be configured for controlling the operation of the mechanical pumping system 210 and the ultra-high vacuum pump 220. The mechanical pumping system 210 and the ultra-high vacuum pump 220 may be configured for providing an ultra-high vacuum within the vacuum chamber 230. The vacuum chamber may be configured for containing the sample 108, the movable stage 113, the first detector 111, the second detector 112 or parts thereof, and the scanning electron microscope 101 or parts thereof.

The system shown in FIG. 2 comprises the scanning microscope system 100 and a data-processing system 250. The data-processing system 250 may comprise one or more processing units configured to carry out computer instructions of a program (e.g. machine readable and executable instructions). The processing unit(s) may be singular or plural. For example, the data-processing system 250 may comprise at least one of CPU, GPU, DSP, APU, ASIC, ASIP or FPGA. In this example, the processing unit(s) may be configured for forming the X-ray spectrum based on the detected X-rays. In particular, in case of the EDS modality, the processing unit(s) may be configured for counting and sorting the detected X-rays based on the energies of the respective X-rays for the duration of the dwell period. However, in case of the wavelength dispersive X-ray spectroscopy (WDS) modality, the processing unit(s) may be configured for counting and sorting the detected X-rays based on the wavelengths of the respective X-rays.

The data-processing system 250 may comprise memory components, such as a data-storage component 240. The data-storage component 240 as well as the data-processing system 250 may comprise at least one of main memory (e.g. RAM), cache memory (e.g. SRAM) and/or secondary memory (e.g. HDD, SDD). The data-processing system 250 may comprise volatile and/or non-volatile memory such an SDRAM, DRAM, SRAM, Flash Memory, MRAM, F-RAM, or P-RAM. The data-processing system 250 may comprise internal communication interfaces (e.g. busses) configured to facilitate electronic data exchange between components of the data-processing system 250, such as, the communication between the memory components and the processing components. The data-processing system 250 may include external communication interfaces configured to facilitate electronic data exchange between the data-processing system and devices or networks external to the data-processing system. In the example of FIG. 2, the external communication interfaces may be configured for facilitating an electronic connection between the processing components of the data-processing system 250 and components of the scanning microscope system 100, such as the control unit 200*a*. Moreover, the external communication interfaces may be configured for establishing an electronic data exchange between the processing components of the data-processing system 250 and the vacuum controller 200*b*.

Furthermore, the external communication interfaces may also be configured for establishing an electronic data exchange between the data-processing system 250 and the first detector 111. The external communication interfaces may also be configured for facilitating an electronic connection between the data-processing system 250 and the second detector 112. For example, the detected backscattered electron data from every first scanning location may be stored in the data-storage component 240. The processing unit(s) of the data-processing system 250 may be configured for forming the at least one image based on the stored backscattered electron data. The backscattered electron image of the sample and the X-ray spectrum from each second scanning location may be stored in the data-storage component 240.

The data-processing system may also comprise network interface card(s) that may be configured to connect the data-processing system to a network, such as, to the Internet. The data-processing system may be configured to transfer electronic data using a standardized communication protocol. The data-processing system may be a centralized or distributed computing system. The data-processing system may comprise user interfaces, such as an output user interface and/or an input user interface. For example, the output user interface may comprise screens and/or monitors configured to display visual data (e.g. a backscattered electron image of the sample or an X-ray spectrum) or speakers configured to communicate audio data (e.g. playing audio data to the user). The input user interface may e.g. a keyboard configured to allow the insertion of text and/or other keyboard commands (e.g. allowing the user to enter instructions to the scanning microscope system or parameters for execution of a data acquisition method) and/or a trackpad, mouse, touchscreen and/or joystick, e.g. configured for navigating the backscattered electron image or regions identified in the backscattered electron image.

In some examples, the data-processing system 250 may be a processing unit configured to carry out instructions of a program. The data-processing system 250 may be a system-on-chip comprising processing units, memory components and busses. The data-processing system 250 may be a personal computer, a laptop, a pocket computer, a smartphone, a tablet computer. The data-processing system may comprise a server, a server system, a portion of a cloud computing system or a system emulating a server, such as a server system with an appropriate software for running a virtual machine. The data-processing system may be a processing unit or a system-on-chip that may be interfaced with a personal computer, a laptop, a pocket computer, a smartphone, a tablet computer and/or user interfaces (such as the upper-mentioned user interfaces).

The data processing system 250 may also comprise elements implemented in hardware and elements implemented in software. An example may be a use of a hardware-implemented encryption/decryption unit and a software implemented processing of the decrypted data. Further, the data-processing system 250 may comprise a dwell period adjustment component. The dwell period adjustment component may be configured for performing the dwell period adjustment step. More particularly, the data-processing system 250 may comprise at least one storage device wherein the dwell period adjustment component may be stored. The data-processing system 250 may include at least one storage device such that at least one of the dwell period adjustment component may be stored.

In some examples, the dwell period adjustment component may be implemented in software. The dwell period adjustment component may be a software component, or at least a portion of one or more software components. The data-processing system 250 may be configured for running said software components, and/or for running a software comprising the software components. In other words, the components may comprise one or more computer instructions (e.g. machine-readable instructions) which may be executed by a computer (e.g. the data-processing system 250). The dwell period adjustment component may be stored on one or more different storage devices (e.g., memory 1504 of FIG. 15). For example, the components may be stored on a plurality of storage components comprising persistent memory, for example a plurality of storage devices in a RAID-system, or different types of memory, such as persistent memory (e.g. HDD, SDD, flash memory) and main memory (e.g. RAM). The components may also be implemented at least partially in hardware. For example, the dwell period adjustment component or at least a part of one of their functionalities may be implemented as a programmed and/or customized processing unit, hardware accelerator, or a system-on-chip that may be interfaced with the data-processing system 250, a personal computer, a laptop, a pocket computer, a smartphone, a tablet computer and/or a server.

Figure 3:
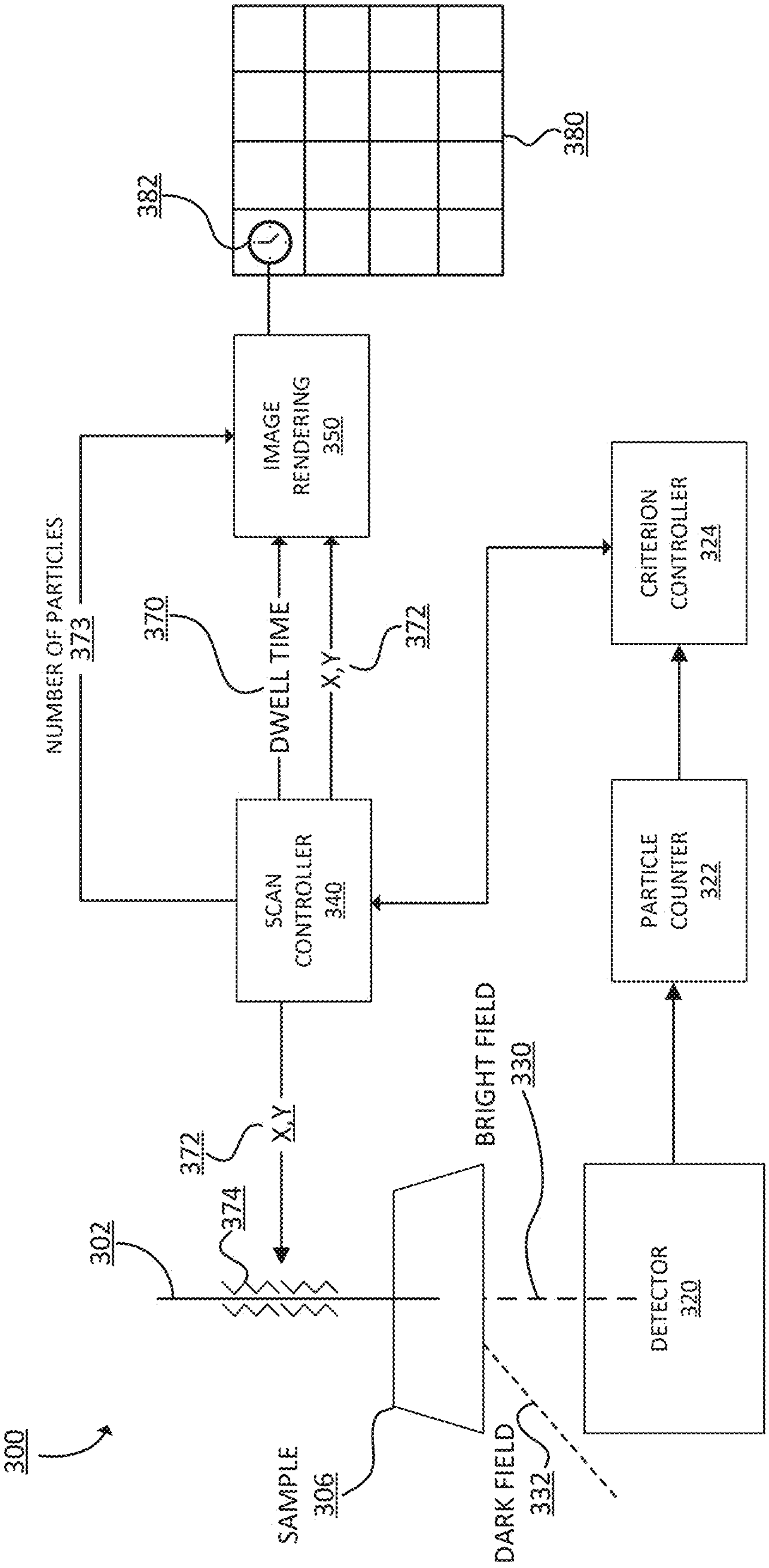
FIG. 3 is a system diagram depicting an example of a microscope system, according to some embodiments.

FIG. 3 is a system diagram depicting an example of a microscope 300, according to some embodiments. By way of example, the microscope 300 may include a spectrometer that functions using various modalities such as, but not limited to, EDX, EELS, 4D scanning transmission electron microscopy (4D STEM), or similar. In addition, the microscope 300 is an example of a component of microscope 100 of FIG. 1 and/or the microscope system 200 of FIG. 2. The microscope 300 may be used to acquire data from a sample 306 (e.g., semiconductor, protein, molecule, circuit, etc.) which receives a beam 302 (e.g., photons, electrons, ions, etc.) from a beam source (not depicted). The beam 302 may be directed by scanning optics 374 (e.g., lenses, electro-optics, etc.) which function to adjust the beam 302 according to scanning locations received from a scan controller 340. The scan controller 340 may function to scan the beam across the sample 306 in a scan pattern (e.g., raster, staircase, etc.) to ensure that a region of interest on the sample 306 is interrogated by the beam 302 for imaging by a detector 320 (e.g., scintillator, CCD, etc.).

In some examples, different electron populations may be detected when using a charged particle beam. For example, unscattered transmitted electrons (bright field 330) may be received by the detector 320 which may provide high contrast images (e.g., dark and light contrast) between various scanning locations of the sample that was imaged. In addition, scattered electrons (dark field 332) may be received by a dark field detector to image features such as crystal defects, stacking faults, or similar. Depending on a type of the sample, sample structure, and contrast requirements, the microscope 300 may utilize detector 320 which may include a first detector for bright field 330 and/or a second detector 320 for dark field 332 which may be physically separated or integrated into one structure. In some examples, the detector 320 may detect charged particles such as electrons and/or ions, photons such as X-ray photons, ultraviolet photons, visible photons, infrared photons, or combinations thereof. In addition, the detector 320 may be any detector with counting or continuous integrating output (e.g., STEM detectors, EDX detectors, cathodoluminescence detectors with counting, and/or counting pixelated detectors such as cameras and 4D STEM) which may be used as input for one or more scan processes as disclosed herein.

In some examples, the detector 320 may generate an analog signal corresponding to one or more detected "hits" received (e.g., how many particles were received by the detector). For example, the detector 320 may be configured according to a duty cycle to relay the analog signal every time a hit is detected or according to a pre-determined scan cycle (e.g., every few microseconds). The analog signal may be received by a particle counter 322 which transforms the analog signal into a digital signal which may include a cumulative number of particles the detector 320 received during a dwell time of a dwell period (e.g., one to one-hundred microseconds) for a particular scanning location (e.g., scanning location of the beam on the sample). By way of example, the dwell time may represent an actual amount of time spent scanning the particular location of the sample, whereas the dwell period may represent one of: a total time permitted to scan the particular location of the sample, a maximum time permitted to scan the particular location of the sample, and/or a cutoff time according to some embodiments herein.

In some embodiments, the particle counter 322 may relay the cumulative number of particles to a criterion controller 324 for a comparison. The criterion controller 324 may include various software and/or hardware components to make determinations on whether or not the cumulative number of particles in the digital signal has reached a signal criterion (e.g., between one and one-hundred particle counts). For example, the criterion controller 324 may receive the digital signal from particle counter 322 indicating that the cumulative number of particles is equal to six particle events during the dwell time (e.g., a few microseconds). In this example, the criterion controller 324 may compare the six particle events to the signal criterion that may be user-defined (e.g., using a graphical user interface to define a desired signal criterion). In an instance where the cumulative number of particles is equal to or greater than the signal criterion, the criterion controller 324 may communicate with the scan controller 340 that a current scanning location has met the desired threshold during the dwell period. In the event that the criterion controller 324 determines that the desired signal criterion has been satisfied, the scan controller 340 may control scan optics to move to the next scanning location in the scan pattern. In a non-limiting example, the beam may be blanked when the desired signal criterion is met and/or when a maximum dwell period has been reached.

In some embodiments, the scan controller 340 may relay the dwell period 370 for the scanning location corresponding to a location on the sample that reached the signal criterion to an image rendering device 350 (e.g., hardware, software, firmware, etc.) to render an image 380. For example, for each location of the sample 306 which corresponds to a unique image pixel, a corresponding unique dwell time 370 for each location is recorded when the signal criterion is reached. By way of example, for a specific location which reached the signal criterion during dwell time $t_{dwell}$, the image rendering device 350 may assign the corresponding image pixel an image pixel intensity value as a function of the dwell time (e.g., $1/t_{dwell}$, $t_{dwell}$, or similar). For example, a first pixel with a dwell time $t_{dwell}$ of one microsecond may be brighter than a second pixel with a dwell time $t_{dwell}$ of half a microsecond. In contrast, if an image pixel intensity value is defined as $1/t_{dwell}$, then a dwell time $t_{dwell}$ of one microsecond may be be dimmer than a second pixel with a dwell time of half a microsecond. In various examples, an image pixel intensity value may be a function of one or more dwell times across one or more scanning passes. In other examples, an image pixel intensity value may be determined, at least in part, as a function of i) a dwell time and a number of particles 373 detected at a particular scanning location (e.g., a convolution, ratio, or similar), ii) a minimum intensity, iii) an undefined value, iv) a maximum intensity, v) one or more dwell times, vi) a number of particles 373, or combinations thereof. In some embodiments, the scan controller 340 may implement components such as the detector 320, particle counter 322, criterion controller 324, and/or the image rendering device 350.

In some examples, a feedback loop may exist between the detector 320 and the scan controller 340 such that the cumulative number of particles per location may remain substantially constant. For example, the scan controller 340 may ensure that an amount of particles per scanning location remains substantially constant by scanning the next scanning location once the signal criterion is met. Using this configuration, the dwell time per location may represent an inverse of an imaging parameter. For example, after the image 380 is complete, image contrast and image brightness (e.g., gain and offset) may be adjusted since a digital conversion from dwell times per location to grayscales may be performed since the number of particles detected is substantially the same across each location. In addition, amplification electronics for the detector 320 may be preset such that the amplification electronics operate in an optimal working range for a present number of particles.

In some examples, a lockup prevention mechanism (not depicted) may be implemented which may limit a dwell period (e.g., maximum dwell period or similar) for one or more scanning locations of the sample 306 which generate little to no signal (e.g., too few or no particles detected). Once the dwell period is reached, the scan controller 340 may store the scan coordinates 372 and number of particles 373 detected in a memory (e.g., such as memory 1504 of FIG. 15) for later retrieval if necessary (e.g., more scanning passes, different detectors, or similar). The lockup prevention mechanism may ensure that the sample 306 is scanned in a timely manner and also prevents potential damage to the sample 306 by overexposure to the beam. The dwell period may be preset or may be dynamically determined (e.g., by prediction algorithms or similar).

Figure 4:
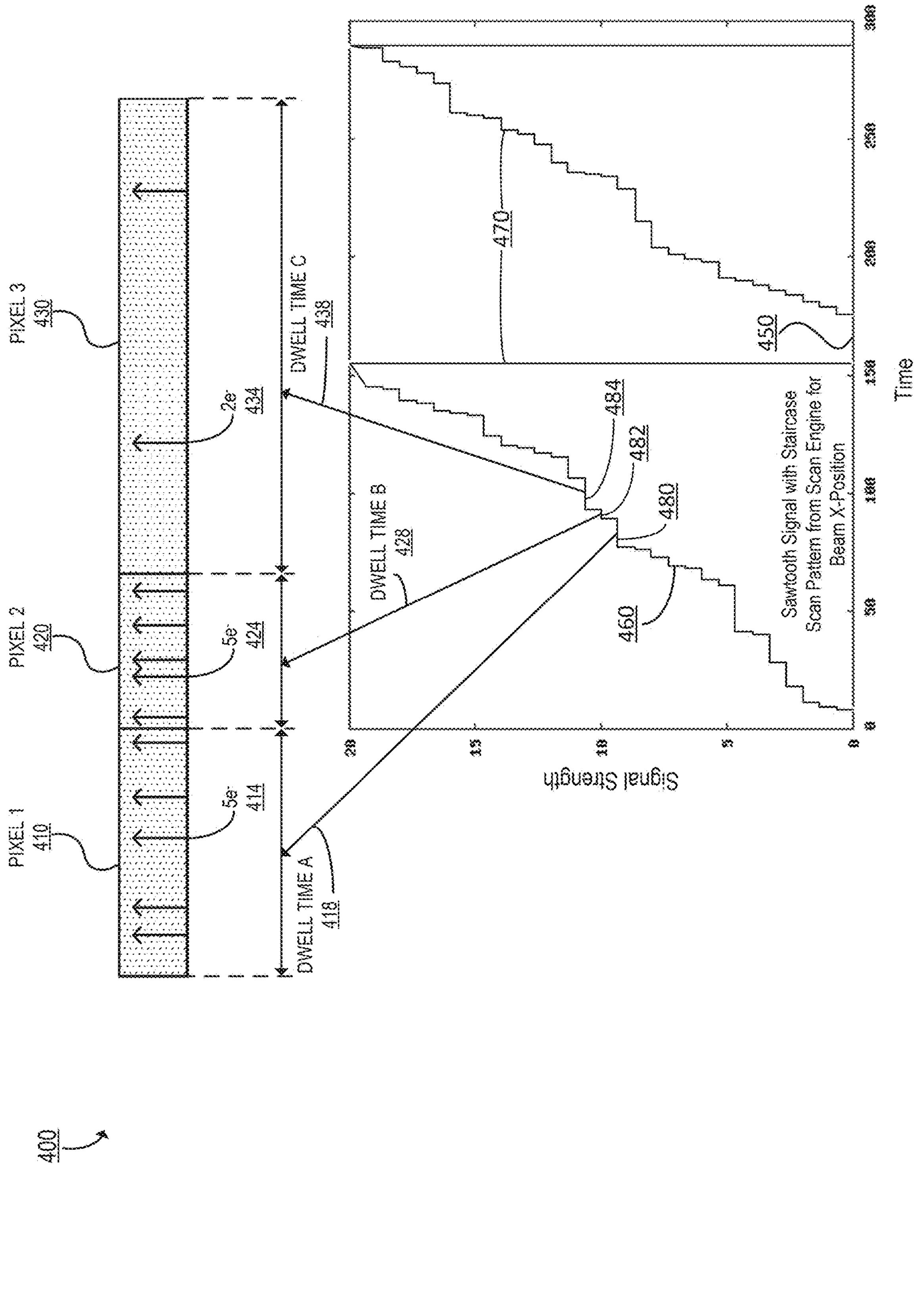
FIG. 4 is a diagram depicting an example adaptive sawtooth staircase scan pattern diagram, according to some embodiments.

FIG. 4 is diagram depicting an example adaptive sawtooth staircase scan pattern 400, according to some embodiments. The pattern 400 may be implemented by one or more components of microscope 300 of FIG. 3. In some examples, a beam 302 may be scanned over a sample 306 according to a sawtooth staircase scan pattern. The sawtooth staircase scan pattern may include any number of sawtooth waveforms 470 in order to fully image the sample 306. The sawtooth waveforms 470 may be separated by one or more dead zones 450 between teeth to accommodate for overshoot and to stabilize the scan controller 340 electronics. The beam 302 may be scanned over the x-direction (e.g., fast scan direction) of the sample 306 while a staircase signal controls a y-direction (e.g., slow scan direction). The scan controller 340 may include any suitable electronics that are fast enough and have sufficient bandwidth to accommodate the sawtooth staircase scan pattern with adaptive dwell times.

In a non-limiting example, the beam 302 may interact with a first scanning location of the sample 306 to produce particles (e.g., electronics, ions, x-rays, etc.) for detection. The detector 320 may monitor for the particles at a first scanning location corresponding to image pixel-1 410 according to the scan pattern. The detector 320 may dwell at the first scanning location until a signal criterion (e.g., a number of particles required to be detected) is met or a dwell period (e.g., a time period of a few microseconds to a few milliseconds, commencing at the start of the acquiring of signal at the first scanning location) has been reached. During dwell time A 418 (corresponding to the x-direction scan time 480), the detector 320 may detect a first cumulative number of particles (e.g., five electrons 414). If the first cumulative number of particles meets the signal criterion, then the scan controller 340 may function to move the beam 302, prior to elapse of the dwell period, to a second scanning location corresponding to image pixel-2 420 according to the scan pattern. The scan controller 340 may also function to relay the dwell time A 418 and the scan coordinates 372 to the image rendering device 350 to produce a pixel of an image 380 for the second scanning location. Once at the second scanning location (image pixel-2 420), the detector 320 may restart the process of monitoring for particles. In this example, the detector 320 may detect a second number of particles (e.g., five electrons 424) during dwell time B 428 (corresponding to x-direction scan time 482). The scan controller 340 may receive information from the criterion controller 324 that the signal criterion has been reached by the second number of particles. Subsequently, the scan controller 340 may relay the dwell time B 428 and scan coordinates 372 to the image rendering device 350. Dwell time B 428 may be shorter, equal to, or longer than dwell time A, but equal to or less than the dwell period. The scan pattern 400 may use any suitable dwell time/dwell period scheme, alone or in combination, according to those in FIGS. 3 and 5-12.

Continuing this non-limiting example, the scan controller 340 may control the beam 302 to interact with a third scanning location of the sample according to the scan pattern. The detector 320 may detect a third number of particles (e.g., 2 electrons 434) at a third scanning location (e.g. image pixel-3 430) x-direction scan time 484. In this example, the scan controller 340 may determine that the dwell period has been exceeded since the signal criterion has not been met (e.g., not enough particles detected). In this case, the scan controller 340 may abort or discontinue the acquiring of signal from the location corresponding to image pixel-3 430 and relay that information to the image rendering device 350 along with dwell time C 438 (which is also equal to the maximum dwell period in this example). Additionally, or alternatively, image pixel-3 430 may be assigned an image pixel intensity value as a function of the dwell period $t_{max}$ (e.g., an image pixel intensity value of $1/t_{max}$) and/or as a function of the number of particles detected. The scan controller 340 may then repeat the process to complete all remaining locations on the sample 306.

In some examples, a predictive algorithm (e.g., linear regression, k-nearest neighbors, per-scan-line algorithms, etc.) or appropriately trained artificial intelligence may improve the pattern 400 for the next scanning pass and/or scans of new samples 306 in the future. For example, for each successive scan line only a small deviation in signal strength from a current scan line to the next scan line is expected. The predictive algorithm may record and store this information in order to optimize driver electronics, especially when used with low bandwidth electronics.

Figure 5:
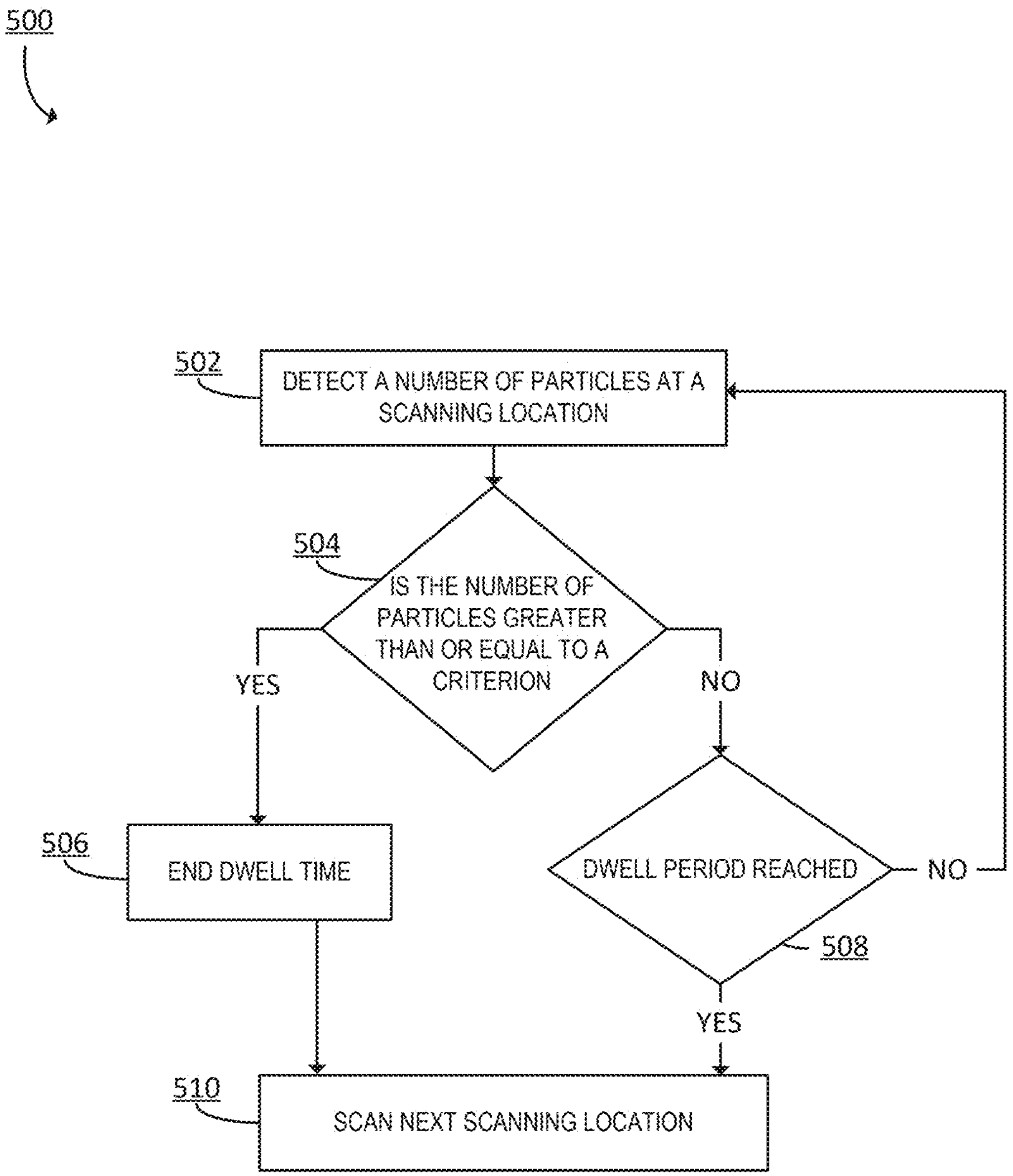
FIG. 5 is a flow diagram of an example scan process with adaptive dwell periods, according to some embodiments.

FIG. 5 is a flow diagram of an example scan process 500 for adaptive dwell times, according to some embodiments. In some embodiments, the scan process 500 may include more or fewer steps than the number depicted in FIG. 5. It should be appreciated that the steps of the scan process 500 may be performed in any suitable order. The scan process 500 may be implemented by one or more components of microscope 300 of FIG. 3 such as under control of the scan controller 340. The flow begins at step 502 where the detector 320 detects a number of particles for a location (e.g., number of electrons for a location corresponding to image pixel-1 410) of the sample 306 at a first scanning location. The particles may be electrons, ions, x-rays, or similar. The detector 320 may detect a first cumulative number of particles associated with the first scanning location of a scan pattern.

The scan process 500 continues at step 504, where a criterion controller 324 determines if the first cumulative number of particles greater than or equal to a signal criterion. The signal criterion may be user defined or predictively determined by an algorithm or historical data and may represent a minimum number of particles needed to advance to the next scanning location. If the first cumulative number of particles is greater than or equal to the signal criterion, the criterion controller 324 notifies the scan controller 340 that the signal criterion has been met and proceeds to step 506. In an instance where the first cumulative number of particles is less than the signal criterion, and the dwell period has reached a maximum dwell period, the flow continues at step 508. In some embodiments, the scan controller 340 may receive input directly from the detector 320 indicating a number of particles have been detected, maintain the count of particles, and compare it to the signal criterion to make a determination on ending the dwell period of the current scanning location or to continue dwelling at and acquiring signal at the current scanning location.

At step 506, the scan controller 340 ends the dwell period on the current location since the signal criterion has been met. The scan controller 340 may relay the current scan coordinates 372 and dwell time spent at the current scan coordinates 372 to the image rendering device 350. In some examples, the scan controller 340 may then reset a counter and clock for an upcoming scanning location.

At step 508, the scan controller 340 makes a determination on whether or not a dwell period (e.g., a few milliseconds) has been reached at the current scanning location. The dwell period may be predefined by or according to the specific scan pattern used, may be user defined, or may be set to a maximum/minimum by default. The scan controller 340 may rely on an internal clock mechanism (e.g., software, firmware, etc.) to determine when the dwell period has expired. In some embodiments, when the scan controller 340 has determined that the dwell period has not expired and that the signal acquisition should continue at the current scanning location, the flow proceeds to step 502 and repeats the process. Once the dwell period has been reached the scan controller 340 aborts the current scanning location and the flow proceeds to step 510 where the scan controller 340 may proceed to scan the next location according to the scan pattern. In some embodiments, the scan process 500 may include more or fewer steps than the number depicted in FIG. 5. It should be appreciated that the steps of scan process 500 may be performed in any suitable order. The scan process 500 may use any suitable dwell time/dwell period scheme, alone or in combination, according to those in FIGS. 3-4 and 6-12.

Figure 6:
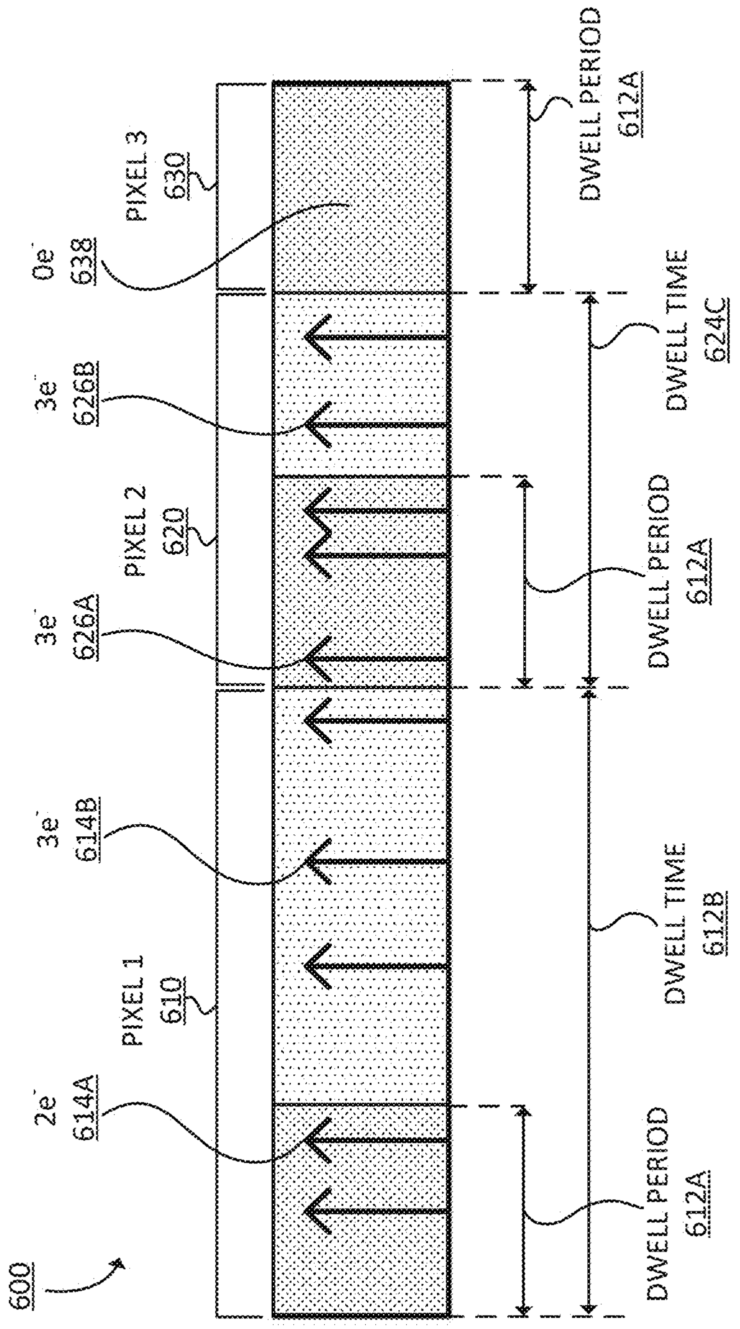
FIG. 6 is a diagram depicting an example scan process using sub-dwell periods, according to some embodiments.

FIG. 6 is an example scan process 600 using sub-dwell periods, according to some embodiments. The scan process 600 may be implemented by one or more components of microscope 300 of FIG. 3 and be a result of the scan pattern according to FIG. 4. The scan process 600 may include scanning the beam 302 on a first scanning location (e.g., corresponding to image pixel-1 610) of the sample 306 to generate particles for detection by a detector 320. A scan controller 340 may monitor for particles during a sub-dwell period (e.g., dwell period 612A). In some embodiments, the scan controller 340 may receive the sub-dwell period as an input from a user of the microscope 300 or the sub-dwell period may be dynamically determined by predictive algorithms or historical data (e.g., such as historical data from memory 1504 of FIG. 15). The sub-dwell period may represent a period of time where a signal criterion (e.g., one to twenty charged particles) needs to be met in order to extend the sub-dwell period to include a larger dwell time (e.g., dwell time 612B). The sub-dwell period may be adaptive for each scanning location or may be fixed for each scanning location. In instances where the signal criterion of particles is not received before the sub-dwell period expires, the scan controller 340 may abort acquiring signal from the scanning location and subsequently instruct the image rendering device 350 to set the image pixel intensity value as a function of the dwell period 612A or similar. In other examples, the image pixel intensity value may be set to a minimum value, no value (e.g., not a number (NaN)), or a suitable function of the dwell period such as, but not limited to, $t_{max}$, $1/t_{max}$, or similar. In examples where the signal criterion of particles is met during the sub-dwell period, the sub-dwell period may be extended until a signal criterion is met or a maximum dwell period (not depicted) has been reached (e.g., similar to the scan process 500 of FIG. 5).

By way of a non-limiting example, the detector 320 may detect a subset of particles 614A (e.g., two electrons) during a first dwell period 612A for a scanning location corresponding to image pixel-1 610. If the subset of particles 614A meets signal criterion (e.g., criterion signal is two electrons) during the first dwell period 612A (e.g., one microsecond to two milliseconds) the scan controller 340 may continue to scan the first scanning location of the sample 306 for a second dwell time 612B. The scan controller 340 may continue to monitor to determine if the signal criterion is met during the second dwell time 612B such as by additional particles 614B (e.g., three additional electrons). Once the scan controller 340 receives information from the criterion controller 324 that the signal criterion is met by one or more of the subset of particles 614A and the additional particles 614B, or a combination thereof, (e.g., a second signal criterion) the scan controller 340 may relay the dwell time 612B and the scan coordinates 372 to the image rendering device 350 to form a first part of image 380.

Continuing this non-limiting example, the scan controller 340 may move the beam 302, based on the signal criterion being met by the previous scanning location corresponding to image pixel-1 610, to the next scan coordinates 372 (e.g., next scanning location) on the sample 306 corresponding to image pixel-2 620. Similar to the previous scan cycle, the scan controller 340 may receive information from the criterion controller 324 on a second cumulative number of particles been received during the dwell period 612A detected at a second scanning location (e.g., corresponding to image pixel-2 620). In this example, the detector 320 may detect a number of particles 626A (e.g., three electrons) during the dwell period 612A. The criterion controller 324 may relay to the scan controller 340 that three particles have been detected which causes the scan controller 340 to extend the dwell period 612A to dwell time 624C where a remaining amount of particles 626B (e.g., two electrons) are needed to satisfy a second signal criterion (e.g., two particles since three particles were already detected during dwell period 612A for a scanning location corresponding to image pixel-2 620). Dwell time 624C may be the same as, less than, or greater than dwell period 612B, but less than or equal to a maximum dwell period (not depicted). In some examples, the scan controller 340 may determine that the second cumulative number does not meet the second signal criterion after the dwell period 624C (e.g., second dwell period) has elapsed such that the dwell period 624C represents the total time to scan the second scanning location of the sample. In this instance, the image rendering device 350 may store an image pixel intensity as a function of dwell period 624C, the total time to scan the second scanning location of the sample, or similar.

Still continuing this non-limiting example, the scan controller 340 may move the beam 302 to the next scan coordinates 372 corresponding to image pixel-3 630. In this example, the scan controller 340 may determine that the acquiring of signal from a scanning location corresponding to image pixel-3 630 should be aborted since there were not enough particles (e.g., zero electrons 638) detected during the dwell period 612A. The scan controller 340 may relay the dwell period 612A and the current scan coordinates 372 to the image rendering device 350. The image rendering device 350 may subsequently assign a maximum value to image pixel-3 630 as a result of not receiving enough particles (e.g., $1/t_{max}$, $t_{max}$, etc.). The scan controller 340 may then move the beam 302 to the next scanning location. In some examples, the sub-dwell period (e.g., dwell period 612A) may be the same for each scanning location or may be different for each scanning location. The scan process 600 may use any suitable dwell period/dwell time scheme, alone or in combination, according to those in FIGS. 3-5 and 7-12.

Figure 7:
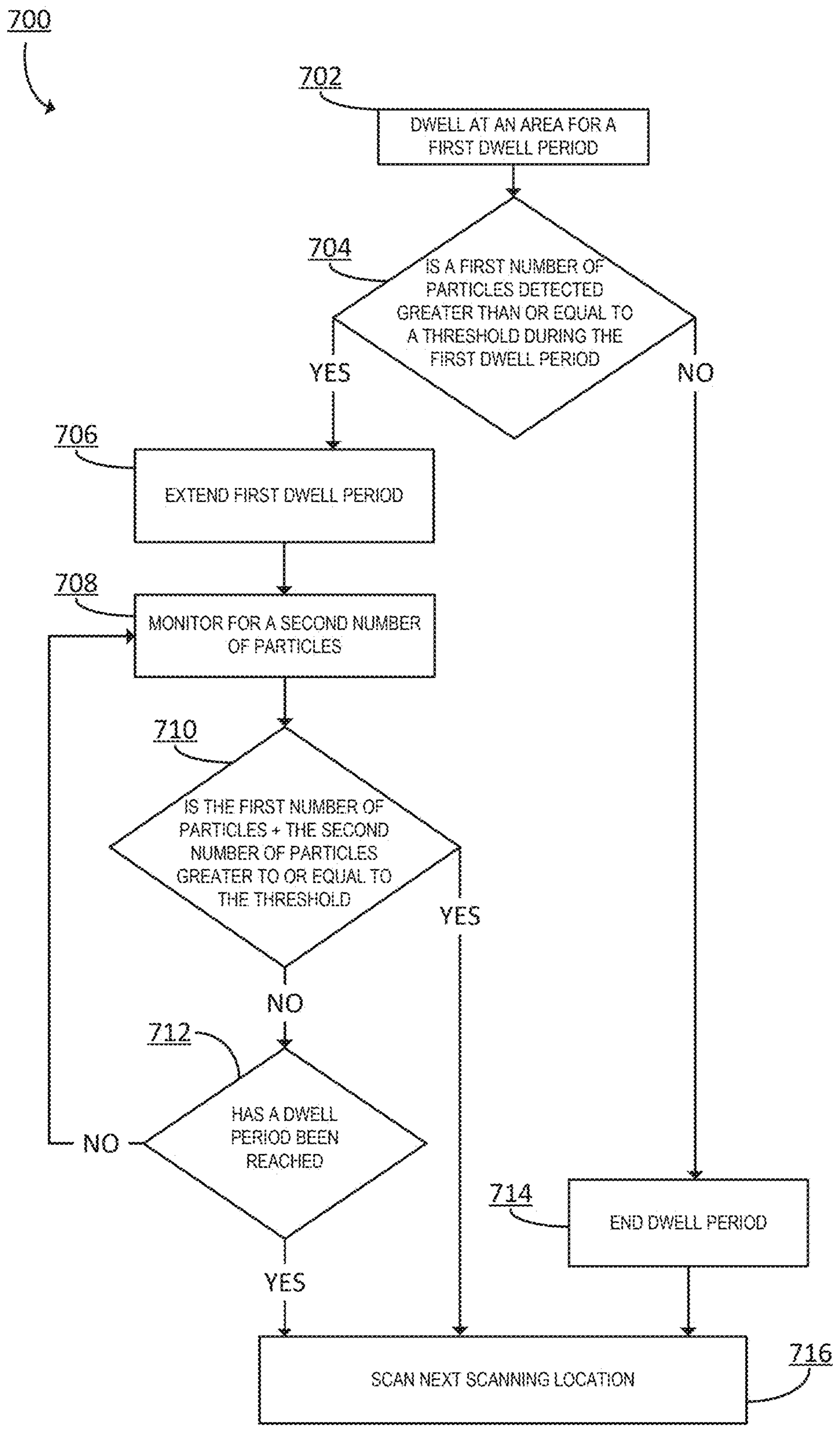
FIG. 7 is a flow diagram of an example scan process utilizing sub-dwell periods, according to some embodiments.

FIG. 7 is a flow diagram of an example scan process 700 utilizing sub-dwell periods, according to some embodiments. The scan process 700 may be implemented by one or more components of microscope 300 of FIG. 3 such as the scan controller 340 and may be a result of the scan pattern according to FIG. 4. In some embodiments, the scan process 700 may include more or fewer steps than the number depicted in FIG. 7. It should be appreciated that the steps of the scan process 700 may be performed in any suitable order. The scan process 700 begins at step 702 where the scan controller 340 controls the beam 302 to dwell at a scanning location for a first dwell period (e.g., one microsecond). The detector 320 may monitor for one or more particles (e.g., x-rays, ultraviolet, light, electrons, etc.) during the first dwell period. At step 704, the scan controller 340 determines if a first number of particles detected by the detector 320 is greater than or equal to a threshold number of particles (e.g., two particles) during the first dwell period. If the scan controller 340 determines that the first number of particles detected during the first dwell period is greater than or equal to the threshold number of particles, the scan process 700 continues at step 706. If the scan controller 340 determines that the first number of particles detected during the first dwell period is not greater than or equal to the threshold number of particles, the scan process 700 continues at step 714. At step 714, the scan controller 340 ends the first dwell period and instructs the image rendering device 350 to set an image pixel intensity value as a value (e.g., a function of the first dwell period, function of a number of particles detected already, or similar). In some embodiments, if the first number of particles detected by the detector 320 is greater than or equal to the threshold during the first dwell time, the scan controller 340 may continue at 716.

At step 706, the scan controller 340 may extend the first dwell period to a maximum dwell period which may include a second dwell time which is larger than the first dwell period. For example, the second dwell time may be equal to or less than the maximum dwell period minus the first dwell period. At step 708, detector 320 detects a second number of particles during the second dwell time, where the second number of particles are different than the first number of particles. At step 710, the scan controller 340 determines if the first number of particles added to the second number of particles is greater than or equal to the threshold. For example, if the threshold number of particles is defined by a user to be five electrons, and three electrons were detected during the first dwell period and two electrons were detected during the second dwell time, then a total of five electrons during the first dwell period and second dwell time would meet the threshold requirement (e.g., by way of the signal criterion) of five electrons. In instances where the threshold is met, the process continues at step 716. In examples where the threshold is not met, the scan controller 340 may determine if the maximum dwell period has been reached. If the threshold has not been reached, the process returns to step 708 to continue to monitor for more particles. If the maximum dwell period has been reached, the scan controller 340 may abort the process of acquiring signal from the scanning location and instruct the image rendering device 350 to set the pixel that corresponds to the scanning location as having an image pixel intensity value corresponding to a function of the maximum dwell period, the number of particles already detected, or similar, similar to step 714. At step 716, the scan controller 340 controls the beam 302 to scan the beam to a next scanning location of the sample 306 and controls the detector 320 to acquire signal data from the next scanning location.

In some examples, a sub-dwell period for a first part of sample acquisition decreases a total acquisition time for the sample 306. For example, if the detector 320 fails to receive enough particles for a subset of scanning locations (having corresponding image pixels) across the sample 306, signal acquisition from that subset of scanning locations is aborted and each pixel corresponding to each scanning location may be assigned an image pixel intensity value which yields faster results as well as improves dose efficiency since the sample 306 will not be overexposed to the beam 302 for longer, unnecessary dwell periods/dwell times. In some embodiments, the scan process 700 may include more or fewer steps than the number depicted in FIG. 7. The scan process 700 may use any suitable dwell period/dwell time scheme, alone or in combination, according to those in FIGS. 3-6 and 8-12. It should be appreciated that the steps of scan process 700 may be performed in any suitable order.

Figure 8:
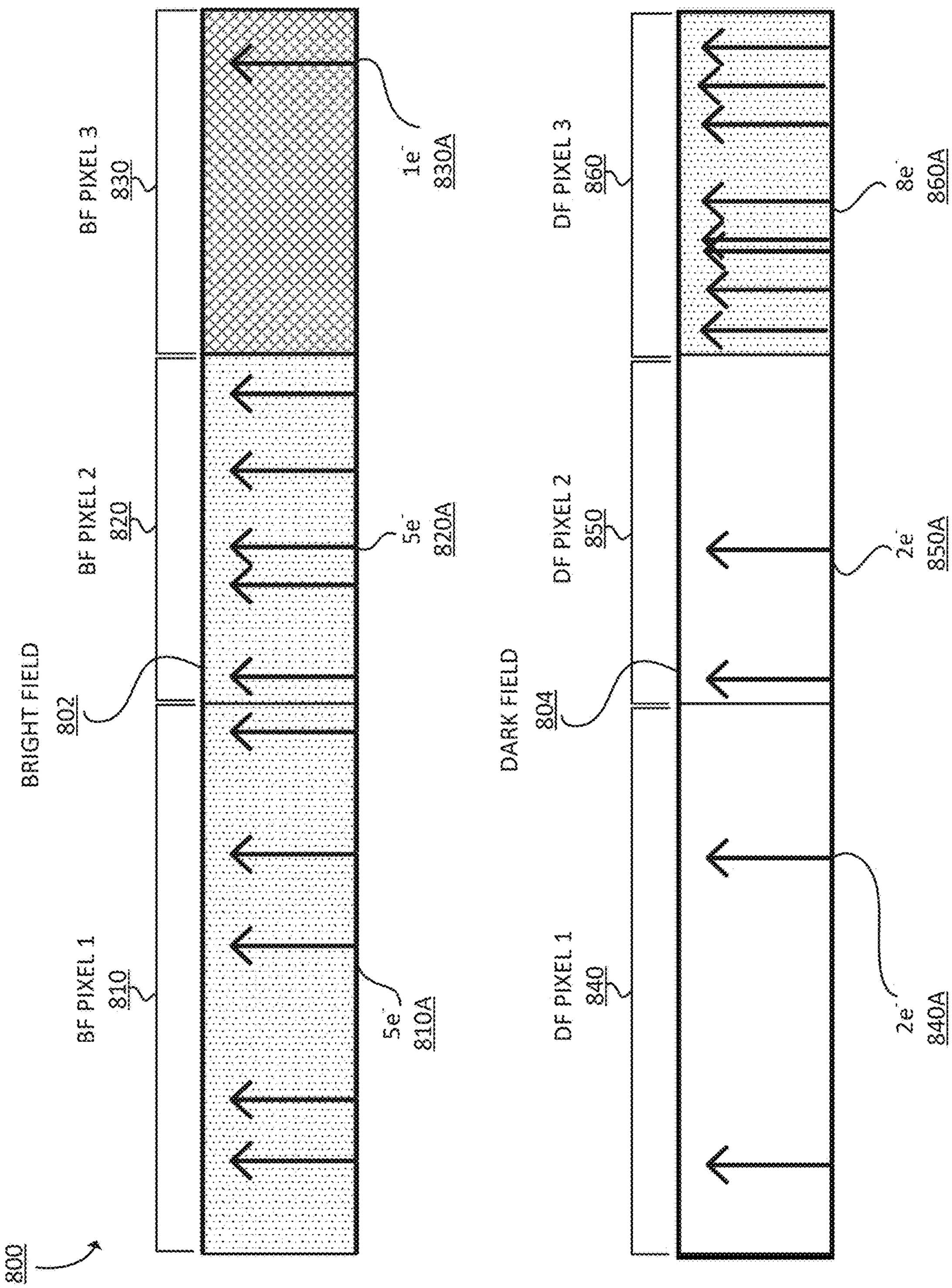
FIG. 8 is an example scan process using bright field and dark field adaptive dwell periods, according to some embodiments.

FIG. 8 is an example scan process 800 using bright field and dark field adaptive dwell times, according to some embodiments. The scan process 800 may be implemented by one or more components of microscope 300 of FIG. 3 such as the scan controller 340 and be a result of the scan pattern according to FIG. 4. The scan process 800 may include scanning the beam 302 on a first scanning location of the sample 306 to generate particles for detection by a detector 320. A scan controller 340 may monitor for particles using detector 320 such as a bright field detector 320 to monitor a bright field 802 and/or a dark field detector 320 to monitor a dark field 804. The scan process 800 may use any suitable dwell period/dwell time scheme, alone or in combination, according to those in FIGS. 3-7 and 9-12. In some embodiments, the scan controller 340 may receive the dwell period as an input from a user of the microscope 300 or the dwell period may be dynamically determined by predictive algorithms or historical data (e.g., such as historical data from memory 1504 of FIG. 15).

In a non-limiting example, the scan controller 340 may determine that enough particles (e.g., five electrons 810A) have been detected during a first dwell time (e.g., during a first dwell time within the first dwell period) on the first scanning location of the sample 306 corresponding to a bright field (BF) pixel-1 810. In some examples, the first scanning location of the sample 306 may be imaged by dark field microscopy in addition to imaging by bright field microscopy such that the first scanning location may also have a corresponding dark field (DF) pixel-1 840. A dark field detector may detect a number of electrons that are diffracted at the first scanning location (e.g., the two electrons 840A) simultaneously with the detection of non-diffracted elections emitted from the first scanning location, corresponding to BF pixel-1 810. Accordingly, the dark field detector may collect data that may be used to generate a dark field image of the first scanning location while the bright field detector simultaneously collects data that may be used to generate a bright field image of the same scanning location. In some instances, the dark field and bright field detectors may be a same detector. The scan controller 340 may initially monitor the bright field 802 until a scanning location of the sample yields no particle counts in which case the scan controller 340 may request information from the criterion controller 324 on whether or not the dark field 804 has detected any particles. In some embodiments, the scan controller 340 may monitor both the dark field 804 and the bright field 802 substantially simultaneously. In either case, the scan controller 340 may move the beam 302 to a second scanning location (e.g., corresponding to an image BF pixel-2 820 and DF pixel-2 850) of the sample 306 for scanning during a second dwell period once enough particles have been detected in one of the bright field 802 or dark field 804 (e.g., electrons 850A). As noted above, the scan process 800 may use any suitable dwell period/dwell time scheme including adaptive dwell times and/or sub-dwell thresholds.

In some embodiments, during the second dwell period, the scan controller 340 may determine that enough particles (e.g., five electrons 820A) have been detected for a scanning location corresponding to BF pixel-2 820 in order to move to a third scanning location (e.g., corresponding to image BF pixel-3 830 and DF pixel-3 860) of the sample 306. In an instance where the scan controller 340 moves the beam 302 to a third scanning location of the sample corresponding to the image BF pixel-3 830, the scan controller 340 may make a determination that a second cumulative number of particles (e.g., one electron 830A) does not meet the signal criterion detected in the bright field 802. In this case, the scan controller 340 may monitor the dark field 804 to determine a third cumulative number of particles detected in the dark field 804 detected by the dark field detector have reached the signal criterion such as requiring five particles to be detected. As depicted, the scanning location corresponding to the DF pixel-3 860 has eight electrons 860A and would meet the signal criterion of five particles. In some examples, the scan controller 340 may abort the acquiring of the bright field signal (e.g., corresponding to BF pixel-3 830) if not enough particles are detected by the bright field detector during the dwell period at the third scanning location of the sample if the signal acquired from the scanning location in the dark field (e.g., DF pixel-3 860) meets the signal criterion. The scan controller 340 may notify the image rendering device 350 that the pixel (e.g., BF pixel-3 830) for the third scanning location of the sample 306 should have an image pixel intensity value such as a function of $t_{max}$. According to some embodiments, the scan controller 340 may then reset a counter (e.g., such as a count of particle counter 322) and clock (e.g., such as a dwell period) and move the beam 302 to a fourth scanning location (e.g., the next pixel, not depicted) of the scan pattern. In addition, the scan controller 340 may make a determination to continue monitoring the dark field 804 for the next scanning location if the acquiring of signal corresponding to the bright field 802 image pixel was aborted. Optionally, the scan controller 340 may store particle counts for the scanning location corresponding to DF pixel-1 840 (e.g., two electrons 840A) and the scanning location corresponding to DF pixel-2 850 (e.g., two electrons 850A) in memory (e.g., such as memory 1504 of FIG. 15) for future reference (e.g., possible future generation of a dark field image). It should be understood that the scan controller 340 may switch, or contemporaneously monitor, between the bright field 802 and dark field 804 based on any suitable parameter such as, but not limited to, dwell period, number of particles detected, user defined settings, or similar. While this scanning scheme began with the bright field 802, it should be understood that the scanning scheme may begin with the dark field 804 based on user preference, historical data, or similar. While bright field and dark field detectors have been discussed herein as complementary detectors monitoring separate fields, it should not be considered limiting and any number of complementary detectors may be used such as core and zero loss electron energy loss detectors, cathodoluminescence and energy dispersive x-ray spectrometry detectors, wavelength dispersive x-ray detectors, etc. may be used alone or in conjunction with detectors described herein.

Figure 9:
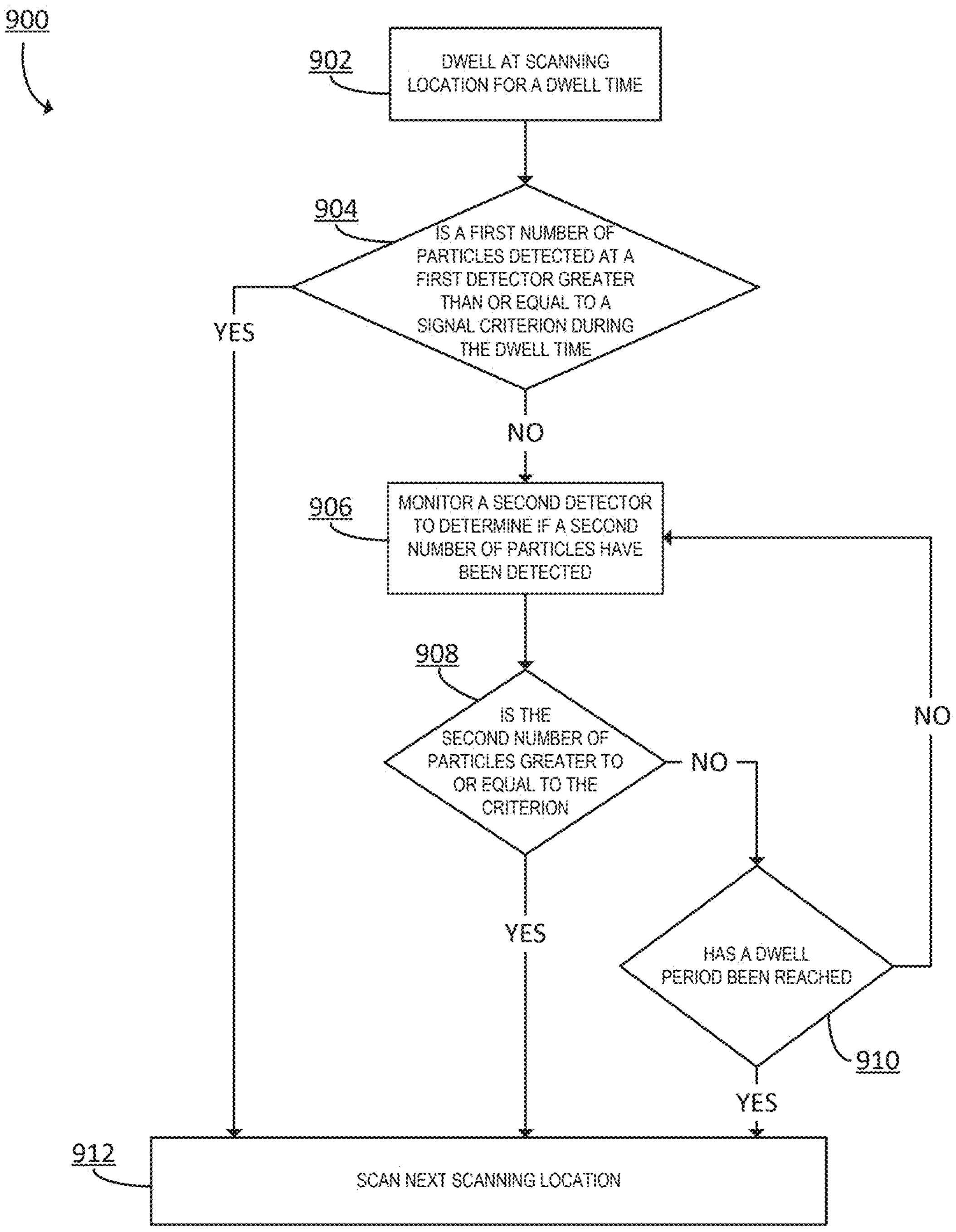
FIG. 9 is a flow diagram of an example scan process for bright field and dark field adaptive dwell periods, according to some embodiments.

FIG. 9 is a flow diagram of an example scan process 900 for bright field and dark field adaptive dwell times, according to some embodiments. The scan process 700 may be implemented by one or more components of microscope 300 of FIG. 3 such as the scan controller 340 and be a result of the scan pattern according to FIG. 4. In some embodiments, the scan process 900 may include more or fewer steps than the number depicted in FIG. 9. It should be appreciated that the steps of the scan process 900 may be performed in any suitable order. The scan process 900 begins at step 902 where the scan controller 340 controls the beam 302 to dwell at a scanning location of the sample 306 for a dwell time for a number of particles that are detected (e.g., such as dwell times as in of FIGS. 3-8 and 10-12). At step 904, the criterion controller 324 determines if a first number of particles at a first detector 320 (e.g., bright field detector) is greater than or equal to a signal criterion during the dwell period. For example, the detector 320 may be a bright field detector and detects five electrons during the dwell period. If the criterion controller 324 determines that the first number of particles detected at the first detector is greater than or equal to the signal criterion, the flow continues at step 912 where the next location of the sample 306 is scanned. If the criterion controller 324 determines that the first number of particles detected at the first detector is less than the signal criterion, the flow may proceed to step 906. It should be understood that while this non-limiting example references begins with a bright field detector, any suitable detector may be assessed first, or, in addition or alternatively, substantially simultaneously with any other suitable detector.

At step 906, the scan controller 340 may monitor a second detector (e.g., dark field detector) to determine if a second number of particles have been detected. For example, the scan controller 340 may work in tandem with the criterion controller 324 to determine if the second detector has detected dark field particles within the same dwell time as the first scanning location. At step 908, the scan controller 340 may determine if the second number of particles is greater than or equal to the signal criterion. For example, the criterion controller 324 may determine that the dark field detector has detected at least five particles. As a result, the criterion controller 324 may report to the criterion controller 324 that the second number of particles detected at the dark field detector is greater than or equal to the signal criterion (e.g., five particles). The scan controller 340 may notify the image rendering device 350 that data acquisition for the first scanning location was aborted in the bright field and to set the first pixel's intensity to an image pixel intensity value (e.g. a function of $t_{max}$). The flow then proceeds to step 912 where the next scanning location is scanned.

In some examples, the criterion controller 324 may determine that the second number of particles is not greater than or equal to the signal criterion. In this instance, the scan process 900 may proceed to step 910 where a determination is made by the criterion controller 324 on whether or not a dwell period for the first scanning location of the sample 306 has been reached. If the dwell period has been reached, the criterion controller 324 may notify the image rendering device 350 to set the corresponding pixel dwell period to a function of the number of particles detected, a maximum value, a minimum value, or combinations thereof. Additionally, the scan controller 340 may control the beam 302 to move to a second scanning location (e.g., the next scanning location) of the sample 306 at step 912. In instances where the dwell period has not been reached, the scan process 900 returns to step 906 to continue to monitor the second detector. In some embodiments, the scan process 900 may include more or fewer steps than the number depicted in FIG. 9. It should be appreciated that the steps of scan process 900 may be performed in any suitable order. The scan process 900 may use any suitable dwell period/dwell time schemes, alone or in combination, according to those in FIGS. 3-8 and 10-12.

Figure 10:
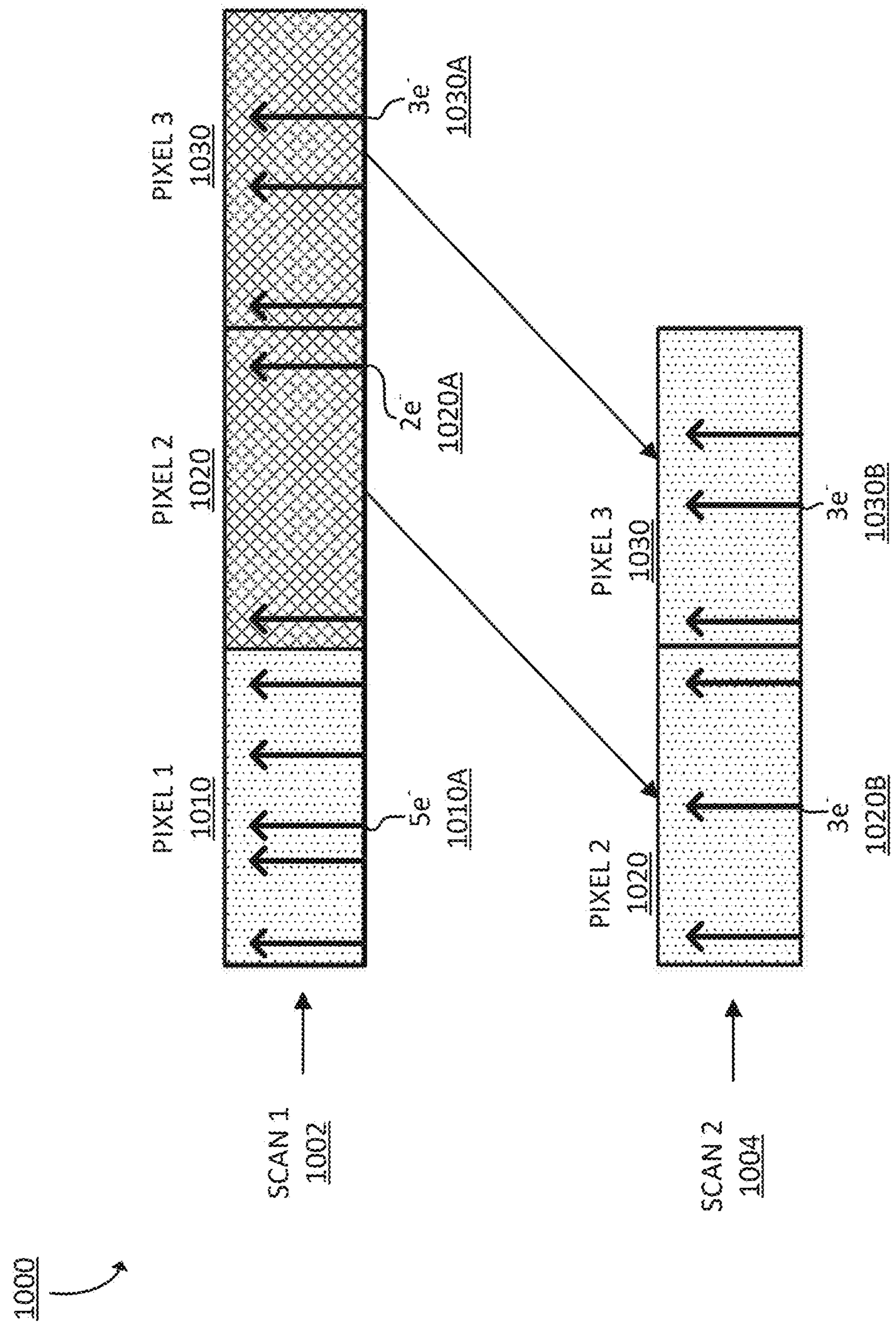
FIG. 10 is an example scan process using multiple scanning passes, according to some embodiments.

FIG. 10 is an example scan process 1000 using multiple scanning passes, according to some embodiments. The scan process 1000 may be implemented by one or more components of microscope 300 of FIG. 3 such as the scan controller 340 and/or be a result of the scan pattern according to FIG. 4. The scan process 1000 may include scanning the beam 302 on a first scanning location (e.g., corresponding to image pixel-1 1010) of the sample 306 to generate particles (e.g., five electrons 1010A) for detection by a detector 320. A scan controller 340 may monitor for particles during a first dwell period. The scan process 1000 may use any suitable dwell period/dwell time schemes, alone or in combination, according to those in FIGS. 3-9 and/or 10-12.

In some examples, the scan process 1000 may include one or more scanning passes (e.g., scan-1 1002, scan-2 1004, etc.) across the sample 306. Scan-1 1002 may include scanning a number of scanning locations to populate image data corresponding to image pixels such as image pixel-1 1010, image pixel-2 1020, image pixel-3 1030, etc. In this example, during scan-1 1002 of a first scanning location corresponding to image pixel-1 1010, five electrons may be detected during the dwell period which would meet a signal criterion of five particles. Subsequently, the scan controller 340 would end the dwell time upon reaching the signal criterion and move the beam 302 to a second scanning location (e.g., image pixel-2 1020) to repeat the process. However, during the scan of the second scanning location, a dwell period may expire before enough particles (e.g., two electrons 1020A) are counted by the criterion controller 324. In this instance, the scan controller 340 may store the number of particles detected during the dwell period (e.g., two electrons 1020A) in memory (e.g., memory 1504 of FIG. 15) for retrieval and comparison on the next scanning pass. In some examples, the scan controller 340 may scan each scanning location of the sample 306 using fixed dwell periods or adaptive dwell times where suitable. In the instance of using fixed dwell periods, the scan controller 340 scans all scanning locations (e.g., provide imaging data for all pixels) of the sample 306 and determines which positions did not reach the signal criterion (e.g., the two electrons 1020A for a scanning location corresponding to image pixel-2 1020 and three electrons 1030A for a second scanning location corresponding to image pixel-3 1030).

In some examples, during a second scanning pass, the scan controller 340 may omit some or all scanning locations which met the signal criterion (e.g., five electrons 1010A for a location corresponding to pixel 1 1010 meets the signal criterion of five particles). In this manner, only the scanning locations which did not meet the signal criterion will be scanned again such as scanning locations corresponding to pixel-2 1020 and pixel-3 1030. For example, during scan-2 1004, a scanning location corresponding to pixel-2 1020 may receive an additional three particles (e.g., three electrons 1020B). The scan controller 340 may function to retrieve the previous particle count (e.g., two electrons 1020A) from the previous scan (e.g., scan-1 1002) and add the previous particle count for that scan coordinate 372 to the particle count of scan-2 1004 (e.g., two electrons 1020A plus three electrons 1020B) and determine if the signal criterion has been met. In a non-limiting example, the dwell times and/or dwell periods, alone or in combination, from the two scans may be added together to yield a total dwell time or, in some examples, a difference and/or ratio of the dwell periods/dwell times for some and/or all completed scanning passes may be utilized to determine pixel intensity, future scanning passes, etc. The scan controller 340 may perform this operation on all locations which have not reached the signal criterion by making comparisons between the current scan and all previous scans (e.g., three electrons 1030A plus three electrons 1030B, etc.). In some embodiments, the scan controller 340 may determine a difference between the signal criterion and the total number of particles detected to determine whether the scanning location is to be excluded from or included in one or more additional scanning passes. In addition, the additional scanning passes may continue until the difference is equal to or smaller than zero.

In some examples, the scan controller 340 may tally the scanning locations in real-time or may complete a scan and compute the particle sums for scanning locations at the completion of the scan. While only two scans are depicted, any suitable number of scans may be performed to scan relevant scanning locations of the sample 306. In some examples, a lockup prevention mechanism (e.g., similar to, or the same as the lockup prevention mechanism of FIG. 3) may function to stop further scanning passes after a certain number of scanning passes have been completed. For example, if a number, n, of scanning passes (e.g., five to ten passes) have been completed and only a specific percentage of the sample has been scanned which yield a desired amount of particles according to the signal criterion (e.g., about 76%), and based on a number of scanning locations which have not met the signal criterion (e.g., about 24%), then the image rendering device 350 may assign all remaining locations which have not met the signal criterion an image pixel intensity value (e.g., $n \times t_{max}$, or $n \times 1/t_{max}$) or a value proportional to a cumulative number of particles detected at the scanning location.

Figure 11:
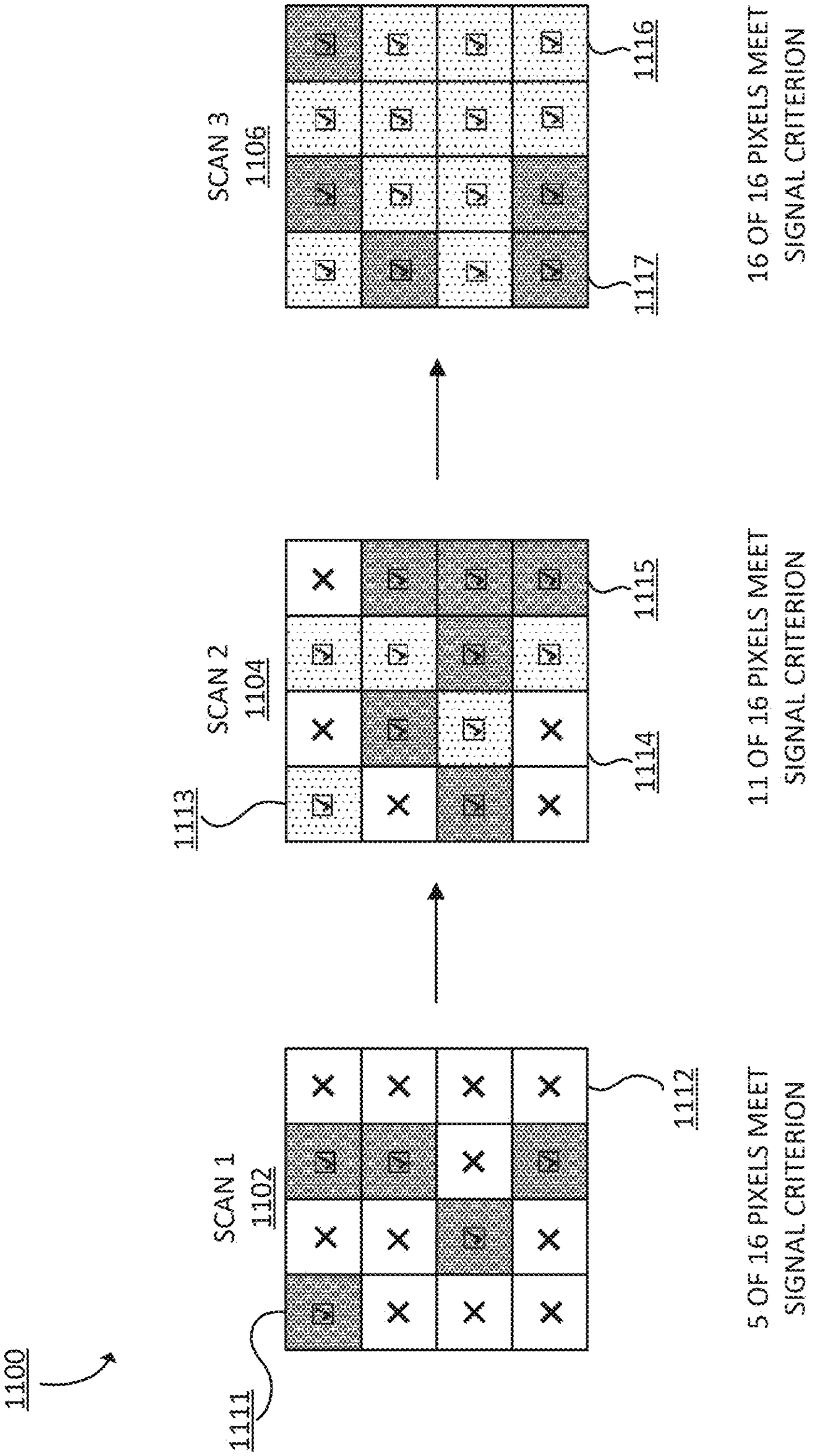
FIG. 11 is a diagram depicting an example pattern for re-scanning locations of a sample, according to certain aspects of the present disclosure.

FIG. 11 is a diagram depicting an example pattern 1100 for re-scanning portions of a sample, according to certain aspects of the present disclosure. The pattern 1100 may be implemented by one or more components of microscope 300 of FIG. 3 and be a result of the scan pattern according to FIG. 4. The pattern 1100 may include scanning the beam 302 across locations of a sample 306. For the sake of simplicity, the sample 306 is depicted in FIG. 11 as a 4×4 grid of scan coordinates 372, however any suitable size or shape grid for the sample 306 is contemplated within the scope of this disclosure. The pattern 1100 may be constructed using any suitable dwell period/dwell time scheme, alone or in combination, according to those in FIGS. 3-10 and/or 12. The example pattern 1100 depicts a 4×4 grid of sample locations where the respective scanning locations have met the signal criterion denoted by a check mark (e.g., scanning locations 1111 have satisfied the signal criterion). Also included in the scan pattern 1100 are scanning locations that did not meet the signal criterion denoted by a "X" (e.g., scanning location 1112). In this example, five of sixteen scanning locations met the signal criterion during scan-1 1102, whereas eleven of sixteen locations did not meet the signal criterion.

In some examples, similar to scan process 1000, the scan controller 340 may identify which locations need to be scanned during scan-2 1104. After scan-2 1104 has been completed, a number of new scanning locations may be determined to meet the signal criterion (e.g., scanning locations 1115). For example, the second scanning location in the second row (e.g., position (x,y)=(2,2)) may have met the signal criterion due to a combination of particles detected during scan-1 1102 and particles detected during scan-2 1104. In various embodiments, the second scanning location in the second row may have met the signal criterion due to particles detected during just scan-2 1104. In addition, during scan-2 1104, a number of locations (e.g., five locations) may be determined to have not met the signal criterion (e.g., scanning locations 1114) and will be included in the next scan (e.g., scan-3 1106). In some examples, scanning locations that have previously met the signal criterion (e.g., scanning locations 1113) may be omitted from scan-2 1104 (e.g., as in FIG. 10).

In some examples, one or more additional scans may be performed (e.g., scan-3 1106) to ensure each scanning location 1114 which has not met the signal criterion may be re-scanned in order to obtain a complete image 380. For example, after completing scan-3 1106, scanning locations 1117 may each meet the signal criterion forming the complete image 380 (not depicted). Similar to scanning locations 1113, scanning locations 1116 may be omitted from scan-3 1106. The process may be continued for any suitable number of scans to ensure that each location has met the signal criterion (e.g., 16 out of 16 pixels meet signal criterion without triggering the lockup prevention mechanism).

Figure 12:
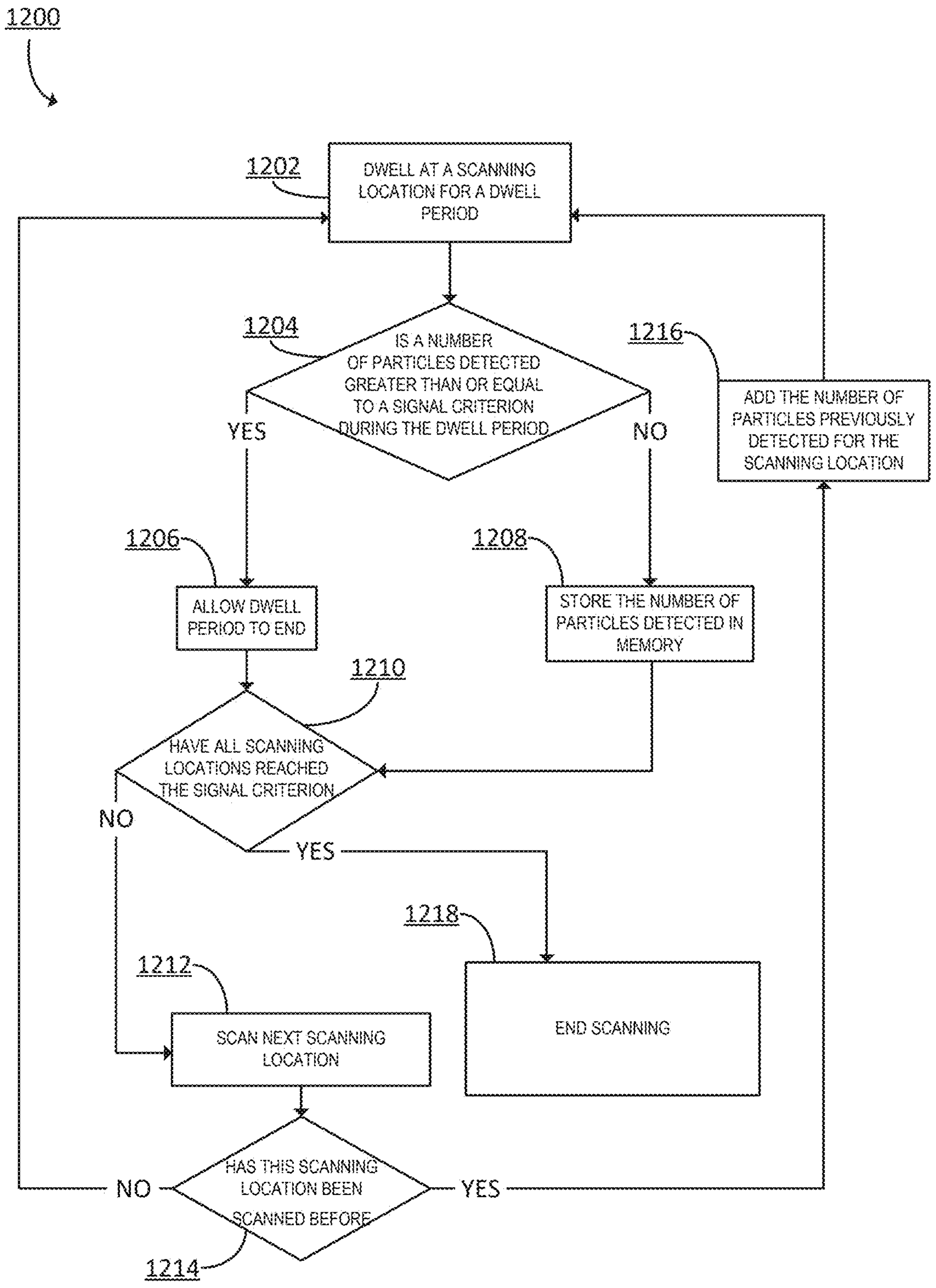
FIG. 12 is a flow diagram depicting an example flow for re-scanning locations of a sample, according to certain aspects of the present disclosure.

FIG. 12 is a flow diagram depicting an example scan process 1200 for re-scanning locations of a sample, according to certain aspects of the present disclosure. The scan process 1200 may be implemented by one or more components of microscope 300 of FIG. 3 such as the scan controller 340 and be a result of the scan pattern according to FIG. 4. In some embodiments, the scan process 1200 may include more or fewer steps than the number depicted in FIG. 12. It should be appreciated that the steps of the scan process 1200 may be performed in any suitable order. The scan process 1200 begins at step 1202 where the scan controller 340 controls the beam 302 to dwell at a pixel (e.g., first scanning location) for a dwell period (e.g., one millisecond). The detector 320 may monitor for one or more particles (e.g., x-rays, ultraviolet, light, electrons, etc.) during the dwell period. While this non-limiting example uses dwell periods, it should be readily apparent that any adaptive dwell time scheme may be implemented alone, or in conjunction with, any suitable dwell period scheme in conjunction with the flow diagram of FIG. 12.

At step 1204, the criterion controller 324 determines if a number of particles detected by detector 320 greater than or equal to a signal criterion (e.g., five particles) during the dwell period. If the number of particles detected by the detector 320 at a first scanning location on the sample 306 is greater than or equal to the signal criterion, the scan process 1200 may proceed to step 1206 where the dwell period at the first scanning location is ended once the signal criterion is met. In the other instance where the number of particles detected by the detector 320 at the first scanning location on the sample 306 is not greater than or equal to the signal criterion, the flow proceeds to step 1208 where the scan controller 340 may store the number of particles detected at the first scanning location in memory (e.g., such as memory 1504 of FIG. 15) for later retrieval and then the scan process 1200 may proceed to step 1210.

At step 1210, the scan controller 340 may make a determination on whether or not all scanning locations of the sample 306 have reached the signal criterion. For example, the scan controller 340 may reference historical data (e.g., from memory 1504 of FIG. 15) to determine which locations have not reached the signal criterion (e.g., using the same or similar signal criterion metrics as in FIG. 3-11). In an instance where not all scanning locations have reached the signal criterion, the scan process 1200 may proceed to step 1212 and scan the next scanning location which has not yet met the signal criterion. In some embodiments, the image rendering device 350 (e.g., image rendering device 1520 of FIG. 15), may detect a presence of a change to the sample by identifying at least one of expansion, compression, movement, shearing within an image of the sample generated between a first scanning pass and a second scanning pass and may function to reduce a sample drift for a second image produced after the second scanning pass. In some examples, step 1214 may involve making a determination if the next scanning location has been scanned before such as by referencing historical data (e.g., determining if scan coordinates 372 produced any particles in the previous scans) or by way of a scan counter which counts how many scanning passes have been completed (e.g., if the counter is zero indicating that this is the first scan pass, then the scan controller 340 will scan the location). In this way, the scan process 1200 may proceed to step 1202 if the scanning location has not been scanned before or to step 1216 where the scan controller 340 may add the number of particles previously detected for the scanning location prior to step 1202 where the scan controller 340 may dwell at the scanning location again for a second dwell period. Returning now to step 1210, if the scan controller 340 has determined that all scanning locations have reached the signal criterion, the scan process 1200 may end at step 1218 where the scan controller 340 ends scanning the sample 306. In some non-limiting examples, the scan controller 340 may make a determination, in conjunction with the signal criterion, and at least partially based on a lockup prevention mechanism, that a scanning location should be removed from future scanning passes and/or that the scanning should end. Examples of lockup prevention mechanisms may include, but are not limited to, i) a scanning location producing zero counts on a certain number of scanning passes (e.g., previous two to ten sequential or non-sequential scanning passes), ii) an incorrect wavelength (e.g., an incorrect X-ray wavelength), iii) no sample at the scanning location, iv) improper calibration, v) a dwell period which is too high (e.g., one minute), or combinations thereof.

Figure 13:
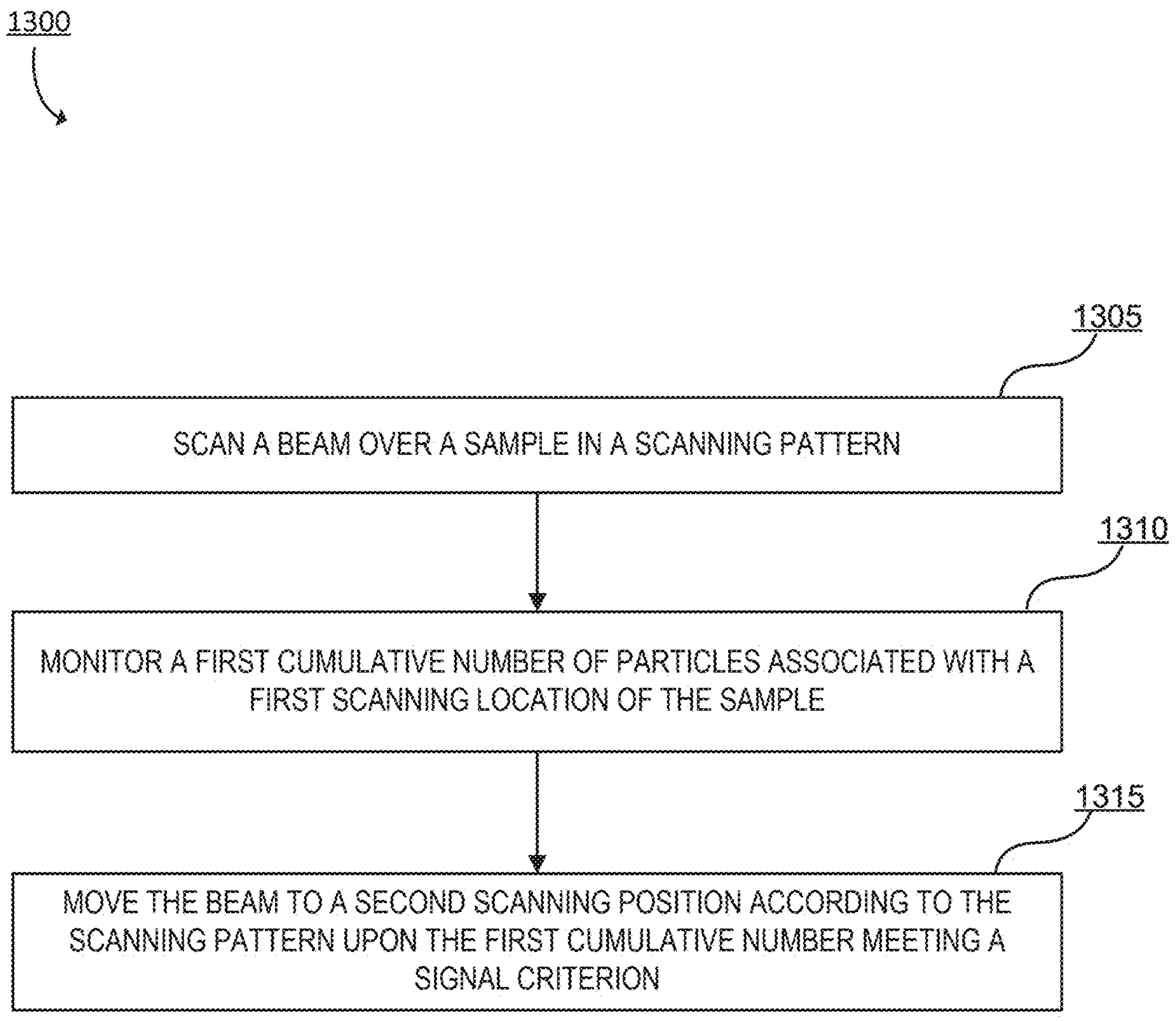
FIG. 13 is a flow diagram depicting an example method, according to certain aspects of the present disclosure.

FIG. 13 is a flow diagram depicting an example method 1300, according to certain aspects of the present disclosure. The method 1300 may be implemented by one or more components of microscope 300 of FIG. 3 such as scan controller 340. In some embodiments, the method 1300 may include more or fewer steps than the number depicted in FIG. 13. It should be appreciated that the steps of the method 1300 may be performed in any suitable order. The method may begin at step 1305 where a beam 302 is scanned over a sample 306 in a scan pattern. The beam 302 may interact with a first scanning location of the sample to produce scattered electrons, unscattered electrons, ions, photons, or similar for detection by a detector 320 or by a dark field detector.

At step 1310, the detector 320 may monitor a first cumulative number of particles associated with the first scanning location of the sample and detected at a first scanning location of the scan pattern. In some examples, the first cumulative number of particles correspond to an interaction of the beam with the first scanning location of the sample. In addition, in various examples, monitoring by at least using the detector 320 may include detecting X-ray photons, ultraviolet photons, visible photons, infrared photons, charged particles, or combinations thereof.

At step 1315, the scan controller 340 may control the beam 302 using scan optics 374 to move the beam 302 to a second scanning location of the scan pattern before a first dwell period elapses if a signal criterion is met. In some examples, the signal criterion may be based on the first cumulative number of particles and includes a first threshold number. In some examples, the signal criterion being met may include the first cumulative number reaching or exceeding the first threshold number. In various other examples, the method may include determining that the first cumulative number of particles does not meet the first threshold number during a second dwell period, where the second dwell period may be shorter than the first dwell period.

Figure 14:
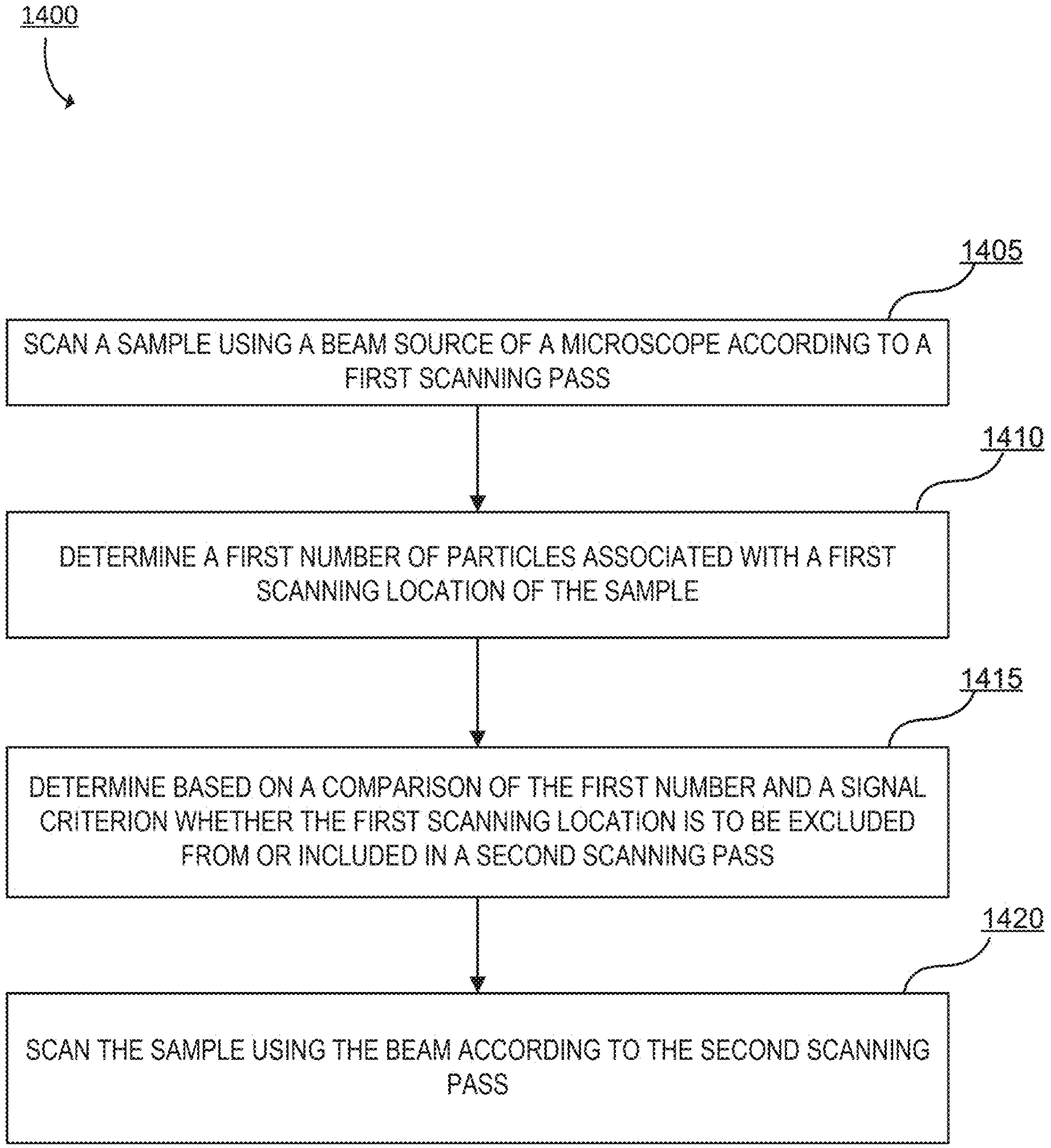
FIG. 14 is a flow diagram depicting an example method, according to certain aspects of the present disclosure.

FIG. 14 is a flow diagram depicting an example method 1400, according to certain aspects of the present disclosure. The method 1400 may be implemented by one or more components of microscope 300 of FIG. 3 such as the scan controller 340. In some embodiments, the method 1400 may include more or fewer steps than the number depicted in FIG. 14. It should be appreciated that the steps of the method 1400 may be performed in any suitable order. The method may begin at step 1405 where the scan controller 340 may control the beam 302 to scan a sample 306 according to a first scanning pass. By way of example, the first scanning pass may include scanning each scanning location of the sample 306 (e.g., such as in the scanning pass in FIG. 11 or FIG. 12). In some examples, each scanning pass of scanning the sample includes exposing each scanning location determined to be included in the scanning pass to the beam for a fixed dwell period and excluding each scanning location determined to be excluded from the scanning pass from the scanning pass from exposure to the beam 302.

At step 1410, the detector 320 may determine a first number of particles associated with a first scanning location of the sample. In some examples, the detector 320 may relay an analog signal to a particle counter 322 for digital conversion into a particle count. The digital signal may then be relayed to the criterion controller 324 to compare the first number of particles to the signal criterion. Subsequently, the criterion controller 324 may relay the results of the comparison to the scan controller 340.

At step 1415, the scan controller 340 may determine, based on at least a comparison of the first number and the signal criterion, whether the first scanning location is to be excluded from or included in a second scanning pass. In some examples, the scan controller 340 may determine a total number of particles detected at the first scanning location for a number of scanning passes already completed and may determine a difference between the total number of particles and the signal criterion. In addition, based on the difference, the scan controller 340 may determine whether the first scanning location is to be excluded from or included in one or more additional scanning passes. In some embodiments, the one or more addition scanning passes continue until the difference is equal to or smaller than zero. Subsequently, sample acquisition data (e.g., image 380) may be generated based, at least in part, on a total number of scanning passes. In other examples, sample acquisition data may be generated based on the lockup prevention mechanism triggering which may produce a partial and/or incomplete image.

At step 1420, the scan controller 340 may control the beam 302 to scan the sample according to the second scanning pass. In some examples, the second scanning pass may be performed on some or all positions of the sample 306 which did not produce enough particles to satisfy the signal criterion. In addition, a dwell period for each scanning location may be adjusted based on the first number of particles detected at the same scanning location during the first scanning pass (e.g., if two electrons were detected in the first scanning pass during one millisecond, the second scanning pass may be reduced to a half millisecond since only three electrons needs to be detected to meet the signal criterion).

Figure 15:
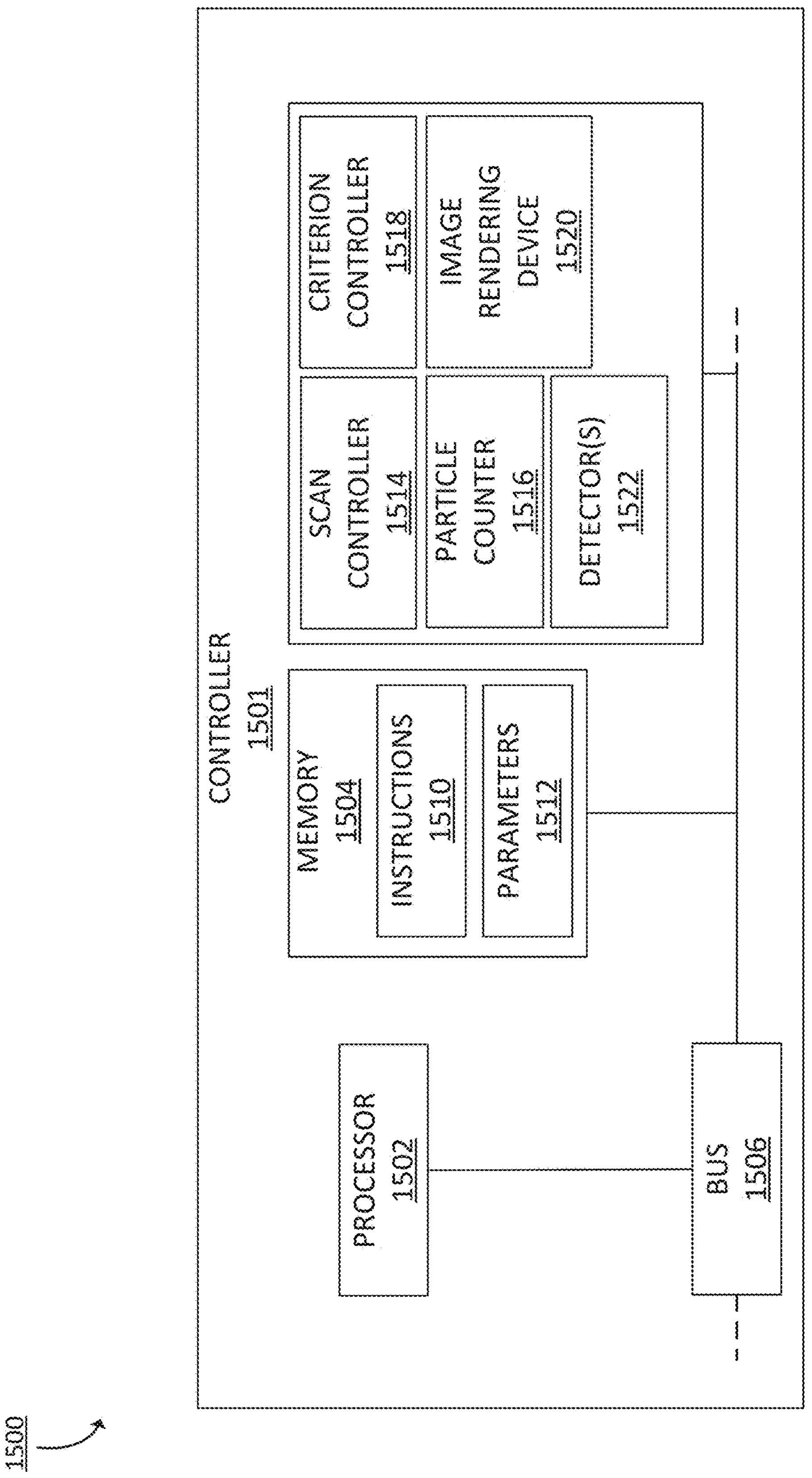
FIG. 15 is a block diagram of a controller for a microscope, according to certain aspects of the present disclosure.

FIG. 15 is a block diagram of a controller 1501 for a microscope system according to certain aspects of the present disclosure. Examples of the electron microscope system can include the scanning microscope system 100 from FIG. 1, the microscope system 200 from FIG. 2, and/or the microscope 300 from FIG. 3. As shown, the controller 1501 includes a processor 1502 communicatively coupled to memory 1504. The processor 1502 can include one processing device or multiple processing devices. Non-limiting examples of the processor 1502 include a Field-Programmable Gate Array (FPGA), an application specific integrated circuit (ASIC), a microprocessor, or any combination of these. The processor 1502 can execute instructions 1510 stored in the memory 1504 to perform operations, such as the operations of microscopes, processes, scans, and methods from FIG. 3-14. In some examples, the instructions 1510 can include processor-specific instructions generated by a compiler or an interpreter from code written in any suitable computer-programming language, such as C, C++, C#, Python, or Java.

The memory 1504 can include one memory device or multiple memory devices. The memory 1504 can be non-volatile and may include any type of memory device that retains stored information when powered off. Non-limiting examples of the memory 1504 include electrically erasable and programmable read-only memory (EEPROM), flash memory, or any other type of non-volatile memory. At least some of the memory 1504 can include a non-transitory computer-readable medium from which the processor 1502 can read instructions 1510 via bus 1506. The bus 1506 may be a communication and/or power bus that enables processor 1502 to communicate with memory 1504. The non-transitory computer-readable medium can include electronic, optical, magnetic, or other storage devices capable of providing the processor 1502 with the instructions 1510 or other program code. Non-limiting examples of the non-transitory computer-readable medium include magnetic disk(s), memory chip(s), RAM, an ASIC, or any other medium from which a computer processor can read instructions 1510.

The memory 1504 can further include information about parameters 1512 (e.g., calibration, tuning, stage positions, beam intensity, etc.), scan controller 1514 (e.g., scan coordinates 372, historical particle counts per pixel, etc.), particle counter 1516 (e.g., sensitivity, gain, ADC conversion, etc.), detector(s) 1522 (e.g., detector control, sensitivity, etc.), an criterion controller 1518 (e.g., DAC conversion, threshold comparisons, etc.), and image rendering device 1520 (e.g., image pixel intensity value, dwell period intensity conversions, scan coordinates 372, etc.). The controller 1501 can receive the information about operating parameters from a microscope, such as a TEM. At least some of the information about any of the controller 1501 components can be pre-stored and can be associated with a various scanning passes. The parameters 1512 can include operating parameters associated with an electron microscope system, such as a desired energy/primary energy of an electron beam, an energy spread of an energy loss spectrum, lockup mechanisms, feedback loops, etc. The controller 1501 can determine or calculate image pixel intensity values based on dwell times and/or dwell periods per scanning location. In some examples, some of the parameters 1512 can be compared to the predetermined thresholds (e.g., known arrangements, known sample types, etc.).

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on electron microscopy systems, these are meant as non-limiting, illustrative embodiments. Embodiments of the present disclosure are not limited to such materials, but rather are intended to address electron beam systems for which a wide array of particles can be applied to imaging, microanalysis, and/or processing of materials on an atomic scale. Such particles may include, but are not limited to, electrons, ions, or photons in TEM systems, SEM systems, STEM systems, ion beam systems, and/or particle accelerator systems.

Some embodiments of the present disclosure include a system including one or more data processors and/or logic circuits. In some embodiments, the system includes a non-transitory computer readable storage medium containing instructions which, when executed on the one or more data processors, cause the one or more data processors to perform part or all of one or more methods and/or part or all of one or more processes and workflows disclosed herein. Some embodiments of the present disclosure include a computer-program product tangibly embodied in a non-transitory machine-readable storage medium, including instructions configured to cause one or more data processors to perform part or all of one or more methods and/or part or all of one or more processes disclosed herein, including, for example, process 1000 of FIG. 10.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

As used in this application and in the claims, the singular forms “a”, “an”, and “the” include the plural forms unless the context clearly dictates otherwise. Additionally, the term “includes” means “comprises”. Further, the term “coupled” does not exclude the presence of intermediate elements between the coupled items.

The systems, apparatuses, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatuses are not limited to any specific aspect or feature or combinations thereof, nor do the disclosed systems, methods, and apparatuses require that any one or more specific advantages be present or problems be solved. Any theories of operation are to facilitate explanation, but the disclosed systems, methods, and apparatuses are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatuses can be used in conjunction with other systems, methods, and apparatuses. Additionally, the description sometimes uses terms like “produce” and “provide” to describe the disclosed methods. These terms are high-level abstractions of the actual operations that are performed. The actual operations that correspond to these terms will vary depending on the particular implementation and are readily discernible by one or ordinary skill in the art.

In some examples, values, procedures, or apparatuses are referred to as “lowest”, “best”, “minimum”, “greater”, “less than”, “equal to” or the like. It will be appreciated that such descriptions are intended to indicate that a selection among many used functional alternatives can be made, and such selections need not be better, smaller, or otherwise preferable to other selections.

The term “image” is intended to comprise a two-dimensional grid, wherein the two-dimensional grid can comprise at least one or a plurality of portions. Each portion is characterized by its coordinates and its value (color and/or intensity). Thus, the image may refer to a visual representation of the sample in gray level variations and/or color variations and/or intensity variations. Further, each portion in the image may correspond to a point (e.g. scanning location) on the sample, a subgroup of pixels, or similar. The image portions may for example be pixels or comprise a plurality of pixels.

The term "spectrum" is intended to comprise a distribution function of a physical quantity (e.g. energy or frequency). A quantity measure may be for example the intensity, the abundance, the rate, or the flux of the respective quantity value. The spectrum may refer to a discrete spectrum, wherein the discrete spectrum may comprise a set of discrete spectral lines at different energy values. The peak of each spectral line at the corresponding line center may correspond to the maximum number of detected photons (e.g. peak intensity) over the corresponding line width. The detected photons may further refer to detected X-ray photons. Each spectral line may correspond to an electronic transition of a chemical element, wherein the energy value of each electronic transition may be unique for the corresponding chemical element. The spectrum may also refer to a continuous spectrum, wherein the continuous spectrum may refer to an intensity distribution over a range of continuous energy values. However, the intensity may also be plotted with respect to the corresponding wavelengths, frequencies or wavenumbers.

Whenever x-, y- and/or z-coordinates or directions are used within this disclosure, the z-direction may be vertical, in other words orthogonal to a ground surface. The x- and y-directions may be orthogonal to each other and to the z-direction, (e.g. they may be horizontal directions). The coordinates may form a Cartesian coordinate system.

The term "scanning location" may refer to a one or more (x,y)-coordinates of locations on the sample or coordinates for corresponding image pixels. The term "scanning location" is intended to comprise a scanning location, point, in and/or on the sample. The scanning location is given by (x,y)-coordinates with respect to an internal coordinate system of the sample and/or the image.

For the sake of clarity, some features may only be shown in some figures, and others may be omitted. However, also the omitted features may be present, and the depicted and discussed features do not need to be present in all embodiments.

Where terms are used without explicit definition, it is understood that the ordinary meaning of the word is intended, unless a term carries a special and/or specific meaning in the field of charged particle microscopy systems or other relevant fields. The terms "approximately", "same", "about", "similar", or "substantially" are used to indicate a deviation from the stated property or numerical value within which the deviation has little to no influence of the corresponding function, property, or attribute of the structure being described. In an illustrated example, where a dimensional parameter is described as "substantially equal" or "approximate" to another dimensional parameter, the term "substantially" or "approximate" is intended to reflect that the two dimensions being compared can be unequal within a tolerable limit, such as a fabrication tolerance. For dimensional values, such as diameters, lengths, widths, or the like, the term "about" can be understood to describe a deviation from the stated value of up to ±ten percent. For example, a dimension of "about ten mm" can describe a dimension from nine mm to eleven mm. In the present disclosure, "sub-ranges" refers to a range of values between the two stated extents and/or including one of the two stated extents.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims.

Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. A method for adaptive pixel dwell times usage in a microscope comprising:

scanning a beam emitted by a beam source over a sample in a scan pattern, wherein the beam interacts with the sample at a first scanning location according to the scan pattern;

monitoring, by at least using a detector of the microscope, a first cumulative number of particles associated with the first scanning location of the sample, wherein the first cumulative number of particles correspond to an interaction of the beam with the sample at the first scanning location; and moving, after a first dwell time and before a first dwell period elapses, the beam to a second scanning location of the sample according to the scan pattern if a signal criterion is met, wherein the signal criterion is based on the first cumulative number of particles.

2. The method of claim 1, wherein the signal criterion includes a first threshold number; and wherein the signal criterion being met includes the first cumulative number reaching or exceeding the first threshold number.

3. The method of claim 1, wherein the signal criterion includes a first threshold number; and wherein the method further comprises:

determining if a second cumulative number of particles meet the first threshold number during a second dwell period, wherein the second dwell period is shorter than the first dwell time.

4. The method of claim 1, wherein monitoring by at least using the detector of the microscope includes detecting X-ray photons, ultraviolet photons, visible photons, infrared photons, charged particles, or combinations thereof.

5. The method of claim 1, further comprising:

determining if a subset of particles of the first cumulative number of particles detected meets a second signal criterion during the first dwell period;

controlling, based on the subset of particles meeting the second signal criterion during the first dwell period, the beam according to the scan pattern to continue to scan the first scanning location of the sample for i) a second dwell period and/or ii) until the signal criterion is met; and moving, based on at least one of: the second dwell period elapsing or the signal criterion being met given a total number of particles being detected, the beam according to the scan pattern to the second scanning location.

6. The method of claim 5, further comprising:

determining that a second cumulative number of particles detected at the second scanning location is smaller than a third threshold number within a third dwell period; and moving, based on the third dwell period elapsing, the beam to a third scanning location of the scan pattern.

7. The method of claim 1, wherein the detector includes a first detector and a second detector, and further comprising:

monitoring, by at least using the first detector, a second cumulative number of particles detected at the second scanning location;

determining that the second cumulative number does not meet the signal criterion;

determining that a third cumulative number of particles detected at the second scanning location by the second detector meets the signal criterion based on the second cumulative number of particles not meeting the signal criterion; and moving, based on the third cumulative number of particles meeting the signal criterion, the beam to a third scanning location according to the scan pattern.

8. The method of claim 1, further comprising:

Determining an image pixel intensity value based on the first dwell time.

9. The method of claim 1, wherein the scan pattern includes a variable staircase pattern; and wherein a scan controller has a bandwidth to facilitate moving the beam according to the variable staircase pattern.

10. A non-transitory computer readable medium having stored thereon computer-readable instructions that, when executed by a processor, cause the processor to perform operations comprising:

controlling a beam source of a microscope to emit a beam towards a sample according to a scan pattern, wherein the beam interacts with the sample at a first scanning location;

monitoring, by at least using a detector of the microscope, a first cumulative number of particles associated the sample at the first scanning location according to the scan pattern, wherein the first cumulative number of particles correspond to an interaction with the sample at the first scanning location; and moving, after a first dwell time and before a first dwell period elapses, the beam to a second scanning location of the sample according to the scan pattern if a signal criterion is met, wherein the signal criterion is based on the first cumulative number of particles.

11. The non-transitory computer readable medium of claim 10, wherein the operations further comprise:

determining the first cumulative number of particles meets the signal criterion; and storing an image pixel intensity value as a function of the first dwell time.

12. The non-transitory computer readable medium of claim 10, wherein the operations further comprise:

monitoring, by at least using the detector, a second cumulative number of particles detected at the second scanning location;

determining that the second cumulative number does not meet a second signal criterion after a second dwell period has elapsed, wherein the second dwell period includes a total time to scan the second scanning location of the sample; and storing an image pixel intensity value as a function of the total time to scan the second scanning location of the sample.

13. The non-transitory computer readable medium of claim 10, wherein the operations further comprise:

monitoring, by at least using the detector, a second cumulative number of particles detected at the second scanning location;

determining the second cumulative number of particles detected at a second detector meets a second signal criterion; and storing, based on the second cumulative number of particles meeting the second signal criterion, an image pixel intensity as a function of second cumulative number of particles, a maximum intensity, and/or a minimum intensity.

14. The non-transitory computer readable medium of claim 13, wherein the detector is one of a bright field detector or a dark field detector; and wherein the second detector is a remaining one of the bright field detector or the dark field detector.

15. A method for multi-scanning in a microscope comprising:

scanning a sample by at least using a beam source of the microscope to emit a beam towards the sample according to a first scanning pass;

determining, by at least using a detector of the microscope, a first number of particles associated with the sample at a first scanning location;

determining, based on a first comparison of the first number of particles and a signal criterion, whether the first scanning location is to be excluded from or included in a second scanning pass;

scanning the sample by at least using the beam source according to the second scanning pass; and generating sample acquisition data based on a total number of scanning passes.

16. The method of claim 15, further comprising:

determining a total number of particles detected at the first scanning location for a number of scanning passes already completed;

determining a difference between the total number of particles and the signal criterion; and determining, based on the difference, whether the first scanning location is to be excluded from or included in one or more additional scanning passes, wherein the one or more additional scanning passes continue until the difference is equal to or smaller than zero.

17. The method of claim 15, wherein each scanning pass of scanning the sample includes exposing each scanning location determined to be included in the scanning pass to the beam for a fixed dwell period and excluding each scanning location determined to be excluded from the scanning pass from exposure to the beam.

18. The method of claim 15, further comprising:

adjusting a dwell period for each scanning location determined to be included in a subsequent scanning pass based on the first number of particles detected at each scanning location during the first scanning pass.

19. The method of claim 15, further comprising:

determining a presence of a change to the sample by identifying at least one of: i) expansion, ii) compression, iii) movement, or iv) shearing within an image of the sample generated between the first scanning pass and the second scanning pass; and reducing a sample drift for a second image produced after the second scanning pass.

20. The method of claim 15, wherein the signal criterion is in a range of 1 to 20 charged particles.

* * * * *